United States Patent
Miyairi

(10) Patent No.: US 8,212,319 B2
(45) Date of Patent: Jul. 3, 2012

(54) SEMICONDUCTOR DEVICE COMPRISING SEMICONDUCTOR FILM WITH RECESS

(75) Inventor: Hidekazu Miyairi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 383 days.

(21) Appl. No.: 12/054,540

(22) Filed: Mar. 25, 2008

(65) Prior Publication Data

US 2008/0308866 A1 Dec. 18, 2008

(30) Foreign Application Priority Data

Apr. 25, 2007 (JP) ................................. 2007-114922

(51) Int. Cl.
*H01L 27/12* (2006.01)

(52) U.S. Cl. .................. 257/347; 257/288; 257/E21.424

(58) Field of Classification Search .................. 257/347, 257/E21.43, 288, E21.424; 438/151, 164
See application file for complete search history.

(56) References Cited

U.S. PATENT DOCUMENTS

| | | |
|---|---|---|
| 5,374,564 A | 12/1994 | Bruel |
| 5,621,239 A | 4/1997 | Horie et al. |
| 5,804,086 A | 9/1998 | Bruel |
| 5,895,766 A | 4/1999 | Manning |
| 5,953,622 A | 9/1999 | Lee et al. |
| 5,965,918 A | 10/1999 | Ono |
| 6,191,007 B1 | 2/2001 | Matsui et al. |
| 6,787,387 B2 | 9/2004 | Ikushima et al. |
| 6,812,508 B2 | 11/2004 | Fukumi |
| 6,958,255 B2 | 10/2005 | Khuri-Yakub et al. |
| 7,019,364 B1 | 3/2006 | Sato et al. |
| 7,235,456 B2 | 6/2007 | Sato et al. |
| 7,253,082 B2 | 8/2007 | Adachi et al. |
| 7,279,700 B2 | 10/2007 | Dantz et al. |
| 2001/0004120 A1* | 6/2001 | Colclaser et al. ............. 257/326 |
| 2002/0063341 A1 | 5/2002 | Fukumi |
| 2002/0090766 A1 | 7/2002 | Moon |
| 2002/0115246 A1 | 8/2002 | Moon |
| 2002/0132448 A1 | 9/2002 | Lim et al. |
| 2003/0042515 A1* | 3/2003 | Xiang et al. .................. 257/288 |
| 2004/0113228 A1 | 6/2004 | Yamada et al. |
| 2004/0124439 A1 | 7/2004 | Minami et al. |

(Continued)

FOREIGN PATENT DOCUMENTS

CN 1692488 A 11/2005

(Continued)

OTHER PUBLICATIONS

European Search Report re application No. EP 08005698.9, dated Jul. 29, 2008.
Office Action re Chinese application No. CN 200810090720.6, dated Oct. 13, 2010 (with English translation).

*Primary Examiner* — Tucker Wright
(74) *Attorney, Agent, or Firm* — Husch Blackwell LLP

(57) ABSTRACT

To provide a semiconductor device having lower junction capacitance, which can be manufactured with lower power consumption through a simpler process as compared with conventional, a semiconductor device includes a base substrate; a semiconductor film formed over the base substrate; a gate insulating film formed over the semiconductor film; and an electrode formed over the gate insulating film. The semiconductor film has a channel formation region which overlaps with the electrode with the gate insulating film interposed therebetween, a cavity is formed between a recess included in the semiconductor film and the base substrate, and the channel formation region is in contact with the cavity on the recess.

10 Claims, 21 Drawing Sheets

U.S. PATENT DOCUMENTS

| | | |
|---|---|---|
| 2005/0081958 A1 | 4/2005 | Adachi et al. |
| 2007/0013005 A1* | 1/2007 | Hara .............................. 257/368 |
| 2008/0003771 A1 | 1/2008 | Sato et al. |
| 2008/0116522 A1* | 5/2008 | Zhu ................................ 257/369 |
| 2008/0265323 A1 | 10/2008 | Miyairi |

FOREIGN PATENT DOCUMENTS

| | | |
|---|---|---|
| EP | 1 213 748 A2 | 6/2002 |
| EP | 1 555 690 A1 | 7/2005 |
| JP | 2001-144276 | 5/2001 |
| JP | 2004-146461 | 5/2004 |

* cited by examiner

SEMICONDUCTOR DEVICE COMPRISING SEMICONDUCTOR FILM WITH RECESS

BACKGROUND OF THE INVENTION

1. Field of the Invention

The present invention relates to a semiconductor device using an SOI (silicon on insulator) substrate and a manufacturing method of the semiconductor device. In particular, the present invention relates to a bonding SOI technique, a semiconductor device using an SOI substrate which is obtained in such a manner that a single crystal semiconductor film or a polycrystalline semiconductor film is bonded to a substrate with an insulating film interposed therebetween, and a manufacturing method of the semiconductor device.

2. Description of the Related Art

Demands for higher integration, higher operation speed, higher performance, and lower power consumption have been more stringent, and in response to the above-described demands, a transistor using an SOI substrate has attracted an attention as effective means that can take the place of a bulk transistor. Higher operation speed and lower power consumption can be expected more in the transistor using the SOI substrate than in the bulk transistor because an insulating film is formed over a semiconductor film in the transistor using the SOI substrate, and accordingly parasitic capacitance can be reduced and generation of leakage current flowing through the substrate can be suppressed. In addition, since the semiconductor film used as an active layer can be thinned, a short channel effect can be suppressed; thus, an element can be miniaturized, and higher integration of a semiconductor integrated circuit can be realized accordingly. Moreover, since the transistor using the SOI substrate is completely latch-up free, there is no possibility that the element is broken due to heat caused by latch-up. Furthermore, the transistor using the SOI substrate does not need element separation unlike the bulk transistor; thus, the transistor using the SOI substrate has advantages in that the distance between the elements can be shortened and higher integration can be realized.

As one of manufacturing methods of an SOI substrate, there is a method in which a semiconductor film is bonded to a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described bonding methods make it possible to form a high-performance integrated circuit, in which a single crystal semiconductor film is used, over all kinds of substrates.

However, in the transistor using the SOI substrate, junction capacitance is formed between an impurity region of the semiconductor film and the substrate. Reduction in the junction capacitance is a very important object for realizing further reduction in power consumption of a semiconductor integrated circuit. It is desired that a material having low permittivity while keeping its insulating property be used for the insulating film interposed between the impurity region and the substrate.

In Reference 1 (Japanese Published Patent Application No. 2001-144276), a transistor having an SON (silicon on nothing) structure in which a cavity is provided between a semiconductor film and a substrate is described. In addition, in Reference 2 (Japanese Published Patent Application No. 2004-146461), a structure of an SOI substrate in which a cavity is provided between a semiconductor film and a substrate is described. The substrate and the semiconductor film are insulated from each other with the use of air, relative permittivity of which is 1, whereby junction capacitance can be reduced.

SUMMARY OF THE INVENTION

However, as for the transistor having the SON structure described in Patent Document 1, a great amount of hydrogen gas, which requires careful handling in a manufacturing process, is used, and furthermore the transistor is needed to be formed through a complicated process due to difficulty in control of the thickness of the semiconductor film and the position of a cavity. Moreover, there is a problem in that characteristics of elements vary because the crystallinity of a region in the semiconductor film where crystal growth progresses and crystals meet each other is inferior to the crystallinity of the other region, and high yield is difficult to be obtained. On the other hand, there is room, on the SOI substrate described in Patent Document 1, for reduction in the junction capacitance of a transistor having an SON structure, which is to be formed.

In view of the foregoing problems, it is an object of the present invention to propose a semiconductor device in which, through a simpler process, junction capacitance and power consumption can be reduced more than conventional, and a manufacturing method of the semiconductor device.

In the present invention, part of a bond substrate (semiconductor substrate) provided with a recess is transferred onto a base substrate (supporting substrate) and thereby a semiconductor film having a cavity between the semiconductor film and the base substrate is formed over the base substrate. Then, a semiconductor device including a semiconductor element such as a transistor is manufactured using the semiconductor film. Specifically, the transistor included in the semiconductor device of the present invention has the cavity between the base substrate and the semiconductor film used as an active layer. One cavity may be provided or a plurality of cavities may be provided. In addition, the cavity may be formed so as to overlap with a channel formation region of the semiconductor film, may be formed so as to overlap either one of a source or a drain, or may be formed so as to overlap with a source, a drain, and a channel formation region.

In a manufacturing method of a semiconductor device of the present invention, a recess which is to be used as a cavity later is formed over a base substrate and then a bond substrate and the base substrate are bonded to each other so that the cavity faces the base substrate, and thereby the cavity is formed between the bond substrate and the base substrate. Then, the bond substrate is split so that part of the bond substrate remains over the base substrate, and a semiconductor film having the cavity between the semiconductor film and the base substrate is formed over the base substrate. After that, the semiconductor film is processed into a desired shape while the cavity is kept between the semiconductor film and the base substrate, whereby a semiconductor element such as a transistor is formed.

In another manufacturing method of a semiconductor device of the present invention, a recess which is to be used as a cavity later and a projection which is to be used as a semiconductor element later are formed over a base substrate. Further, the height of the projection is larger than the depth of the recess, and the region where the recess is formed is included inside the projection. Then, a bond substrate and the base substrate are bonded to each other so that the recess and the projection face the base substrate, whereby the cavity is formed between the bond substrate and the base substrate. Then, the bond substrate is split so that part of the projection remains over the base substrate, and a semiconductor film is formed over the base substrate so that the cavity is included between the semiconductor film and the base substrate. Consequently, a semiconductor element such as a transistor is formed using the semiconductor film formed over the base substrate.

In a transistor included in a semiconductor device of the present invention, a semiconductor film and a cavity are in contact with each other. Thus, parasitic capacitance or junction capacitance of the transistor can be reduced when the cavity is filled with air, nitrogen, an inert gas, or the like that has lower relative permittivity than an inorganic insulating film of silicon oxide or the like. Thus, reduction in power consumption of the semiconductor device can be realized.

Since a cavity can be formed by a method which has already been established, such as etching, in a manufacturing method of the present invention, a cavity with a desired depth and a desired shape can be formed precisely by a safe and simple manufacturing method. Therefore, the cost of manufacture of a semiconductor device can be reduced and yield can be increased.

DETAILED DESCRIPTION OF THE INVENTION

Embodiment Mode

Embodiment Modes of the present invention will be hereinafter described with reference to the accompanying drawings. However, the present invention can be carried out in many different modes and it will be readily appreciated those skilled in the art that modes and details of the present invention can be modified in various ways without departing from the purpose and scope of the present invention. Therefore, the present invention should not be interpreted as being limited to the following description of Embodiment Modes.

Embodiment Mode 1

A structure of a semiconductor film included in a semiconductor element in a semiconductor device of the present invention will be described with reference to FIG. 1A.

Figure 1A:
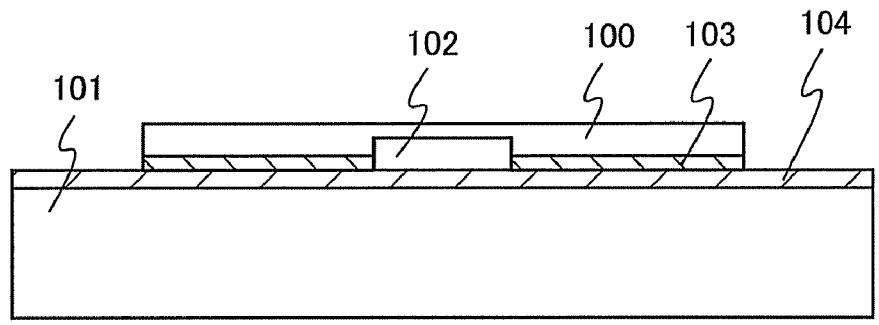
FIGS. 1A to 1C are cross-sectional views illustrating structures of a transistor included in a semiconductor device of the present invention.

A semiconductor film 100 shown in FIG. 1A is formed over a flat base substrate 101. The semiconductor film 100 has a recess on the base substrate 101 side, and the recess forms a cavity 102 between the semiconductor film 100 and the base substrate 101. The position and the number of the cavity 102 is not limited to the structure shown in FIG. 1A. One cavity 102 or a plurality of cavities 102 may be provided between the semiconductor film 100 and the base substrate 101.

Note that an insulating film 103 is formed between the semiconductor film 100 and the base substrate 101 except the region where the cavity 102 is formed. Further, an insulating film 104 is also formed between the insulating film 103 and the base substrate 101. When the insulating film 103 is attached to the insulating film 104; thus, the semiconductor film 100 and the base substrate 101 can be bonded to each other.

The insulating film 103 may be formed of one insulating film or may be formed such that a plurality of insulating films is stacked. Similarly, the insulating film 104 may be formed of one insulating film or may be formed such that a plurality of insulating films is stacked.

The insulating film 104 may be formed over the entire surface of the base substrate 101 or may be partially formed such that the insulating film 104 covers at least a region which overlaps with the insulating film 103.

In FIG. 1A, the semiconductor film 100 and the base substrate 101 are bonded to each other using the insulating film 103 and the insulating film 104; however, the present invention is not limited to the structure. It is not necessary to provide both the insulating film 103 and the insulating film 104, and either one of them may be provided instead. For example, when only the insulating film 104 of the insulating film 103 and the insulating film 104 is formed, the insulating film 104 and the semiconductor film 100 can be attached and thereby the base substrate 101 and the semiconductor film 100 can be bonded to each other. Conversely, when only the insulating film 103 of the insulating film 103 and the insulating film 104 is used, the base substrate 101 and the semiconductor film 100 can be bonded by attaching the insulating film 103 and the base substrate 101 together.

Figure 1B:
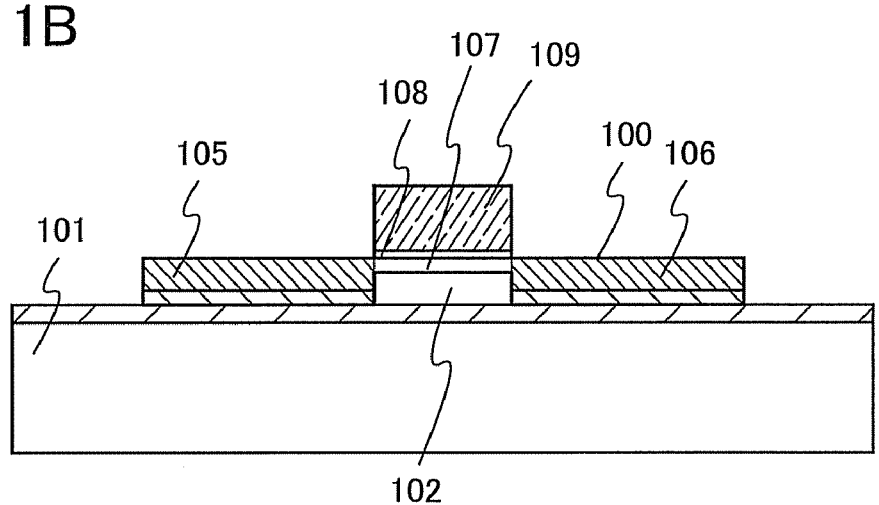

Next, a structure of a transistor, which is one of semiconductor elements using the semiconductor film 100 shown in FIG. 1A is described. FIG. 1B shows an example of a cross-sectional view of the transistor formed using the semiconductor film 100. The transistor shown in FIG. 1B includes the semiconductor film 100 in which a pair of impurity regions 105 and 106, one of which functions as a source and the other as a drain, and a channel formation region 107 are included. In addition, the transistor shown in FIG. 1B includes an electrode 109 which functions as a gate so that the electrode 109 overlaps with the channel formation region 107 with a gate insulating film 108 interposed therebetween.

In a transistor shown in FIG. 1B, a cavity 102 is provided at a position overlapping with the channel formation region 107 and an electrode 109. Note that, in the present invention, the position of the cavity is not limited to the structure shown in FIG. 1B. The cavity may be formed so as to overlap with one of the pair of impurity regions 105 and 106, or may be formed so as to overlap with the pair of impurity regions 105 and 106 and the channel formation region 107. Self-heating can be suppressed more in the case where the cavity is formed so as to overlap with at least the channel formation region 107 than in the case where the cavity is formed so as to overlap with only the impurity regions 105 and 106.

Figure 1C:
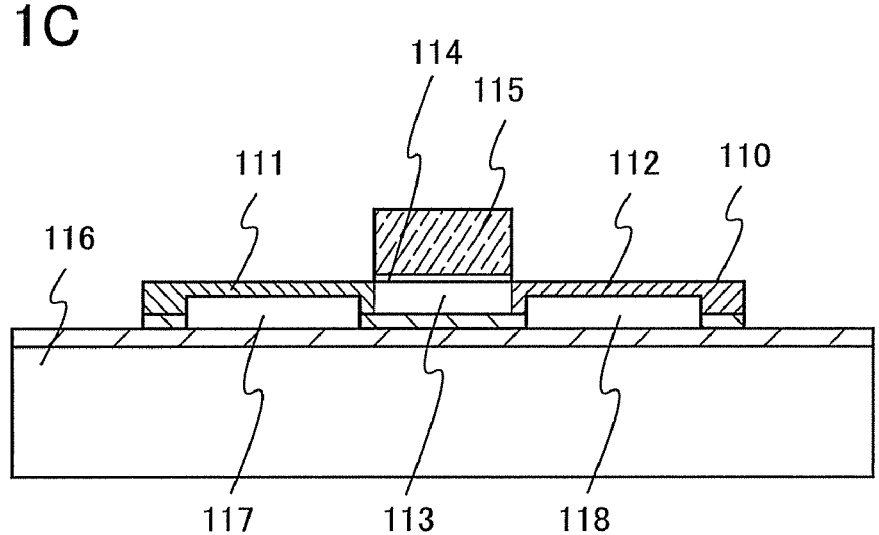

Next, a structure of a transistor using a semiconductor film 110 having two recesses is described. FIG. 1C shows an example of a cross-sectional view of a transistor which is formed using the semiconductor film 110 which has two recesses. The transistor shown in FIG. 1C includes the semiconductor film 110 in which a pair of impurity regions 111 and 112, one of which functions as a source and the other as a drain, and a channel formation region 113 are included. The transistor shown in FIG. 1C includes an electrode 115 which functions as a gate so that the electrode 115 overlaps with the channel formation region 113 with a gate insulating film 114 interposed therebetween.

The transistor shown in FIG. 1C includes cavities 117 and 118 which are formed with the recesses, between the semiconductor film 110 and a base substrate 116. The cavities 117 and 118 are formed at positions overlapping with the pair of impurity regions 111 and 112, respectively. Junction capacitance of the transistor can be reduced more in the case where the cavities 117 and 118 overlap with at least the impurity regions 111 and 112, respectively, than in the case where a cavity which overlaps with only the channel formation region 113 is formed.

In the transistor included in the semiconductor device of the present invention, the cavity 102 is included between the semiconductor film 100 and the base substrate 101, and the semiconductor film 100 is in contact with the cavity 102. In addition, in the transistor included in the semiconductor device of the present invention, the cavities 117 and 118 are included between the semiconductor film 110 and the base substrate 116, and the semiconductor film 110 is in contact with the cavities 117 and 118. Thus, the cavities 102, 117, and 118 are filled with air, nitrogen, an inert gas, or the like that has lower relative permittivity than an inorganic insulating film of silicon oxide or the like, whereby parasitic capacitance or junction capacitance of the transistor can be reduced. It is desirable that the percentage of moisture contained in the above-described gas be decreased in order to suppress volume expansion with temperature change. Note that, in fact, a natural oxide film is formed, in some cases, in a portion of the semiconductor film 100, which is in contact with the cavity 102 and a portion of the semiconductor film 110, which is in contact with the cavities 117 and 118. However, an insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor can be reduced more in the present invention than in the case where the insulating film is formed to the above-described thickness in the portion of the semiconductor film 100, which is in contact with the cavity 102 and the portion of the semiconductor film 110, which is in contact with the cavities 117 and 118.

Note that, although the case where the cavities 102, 117, and 118 are filled with gas is described in this embodiment mode, the present invention is not limited to this structure. For example, the cavities 102, 117, and 118 may be filled with a material other than gas that has lower relative permittivity than an inorganic insulating film of silicon oxide or the like, for example, a porous insulating film (a porous material) including a large number of pores therein.

Note that as the semiconductor device included in the category of the present invention, there are all kinds of semiconductor devices such as microprocessors, integrated circuits such as image processing circuits, and semiconductor display devices. The semiconductor display devices include the following in its category: liquid crystal display devices, light-emitting devices in which a light-emitting element typified by an organic light-emitting element (OLED) is provided for each pixel, DMDs (digital micromirror devices), PDPs (plasma display panels), FEDs (field emission displays), or other display devices in which a circuit element using a semiconductor film is included in a driver circuit.

Embodiment Mode 2

In this embodiment mode, a structure of a transistor included in a semiconductor device of the present invention will be described more specifically.

Figure 2A:
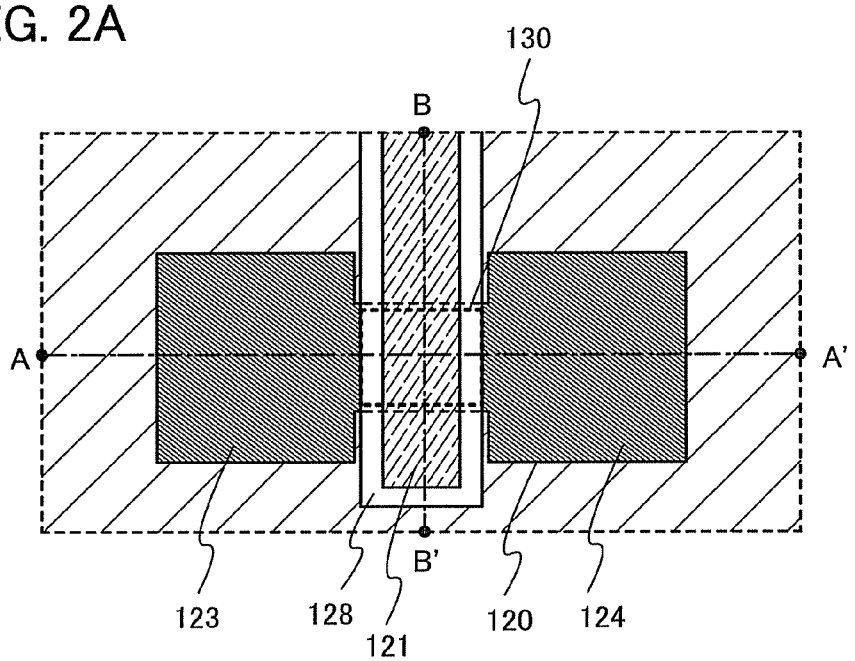
FIG. 2A is a top view illustrating a structure of a transistor included in a semiconductor device of the present invention and FIGS. 2B and 2C are cross-sectional views illustrating the same.
Figure 2B:
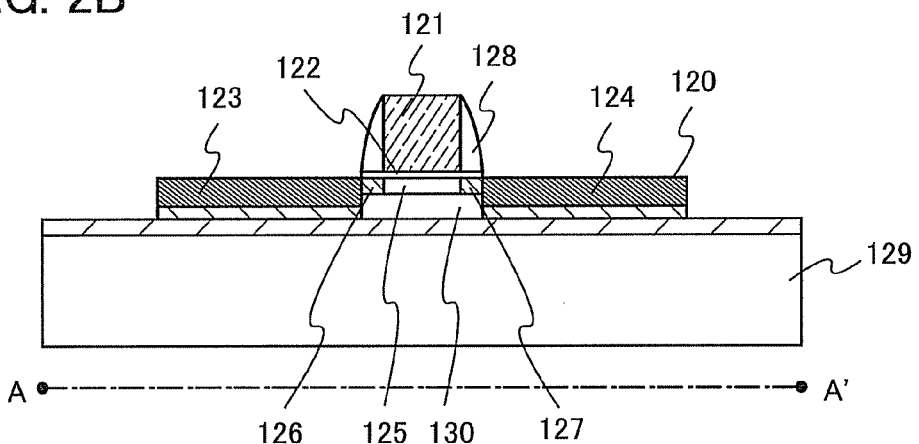
Figure 2C:
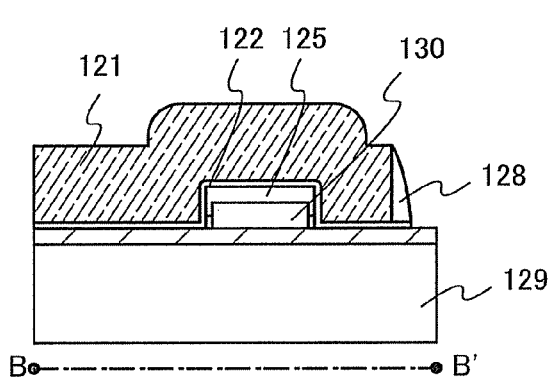

FIG. 2A shows an example of a top view of a transistor included in a semiconductor device of the present invention and FIGS. 2B and 2C each show an example of a cross-sectional view thereof. FIG. 2A is a top view of the transistor, FIG. 2B is a cross-sectional view taken along line A-A' in FIG. 2A, and FIG. 2C is a cross-sectional view taken along line B-B' in FIG. 2A.

The transistor shown in FIGS. 2A to 2C includes a semiconductor film 120 functioning as an active layer, an electrode 121, a portion of which overlapping with the semiconductor film 120 functions as a gate, and a gate insulating film 122 provided between the semiconductor film 120 and the electrode 121. The semiconductor film 120 includes impurity regions 123 and 124, one of which functions as a source and the other as a drain, a channel formation region 125, and LDD (lightly doped drain) regions 126 and 127 provided respectively between the impurity region 123 and the channel formation region 125 and between the impurity region 124 and the channel formation region 125.

A cavity 130 is provided between the semiconductor film 120 and the base substrate 129. The cavity 130 is provided inside a region which overlaps with the semiconductor film 120. Further, the cavity 130 overlaps with the channel formation region 125 in the semiconductor film 120. Self-heating can be suppressed more in the case where the cavity is formed so as to overlap with at least the channel formation region 125 than in the case where the cavity is formed so as to overlap with only the impurity regions 123 and 124.

Note that, although the semiconductor film 120 of the transistor shown in FIGS. 2A to 2C includes the LDD regions 126 and 127, the present invention is not limited to this structure. The LDD regions 126 and 127 are not necessarily provided, or either one of the LDD region 126 or the LDD region 127 may be provided. In addition, although in the transistor shown in FIGS. 2A to 2C, the LDD regions 126 and 127 are provided in regions other than the region in the semiconductor film 120, which overlaps with the electrode 121, the present invention is not limited to this structure. The LDD regions 126 and 127 may be provided in regions overlapping with the electrode 121. Alternatively, the LDD regions 126 and 127 may be provided so as to extend to the region overlapping with the electrode 121 and a region other than the aforementioned region.

Further, although a sidewall 128 which is used as a mask when the LDD regions 126 and 127 are formed is provided on sides of the electrode 121 in the transistor shown in FIGS. 2A to 2C, the present invention is not limited to this structure.

Figure 3A:
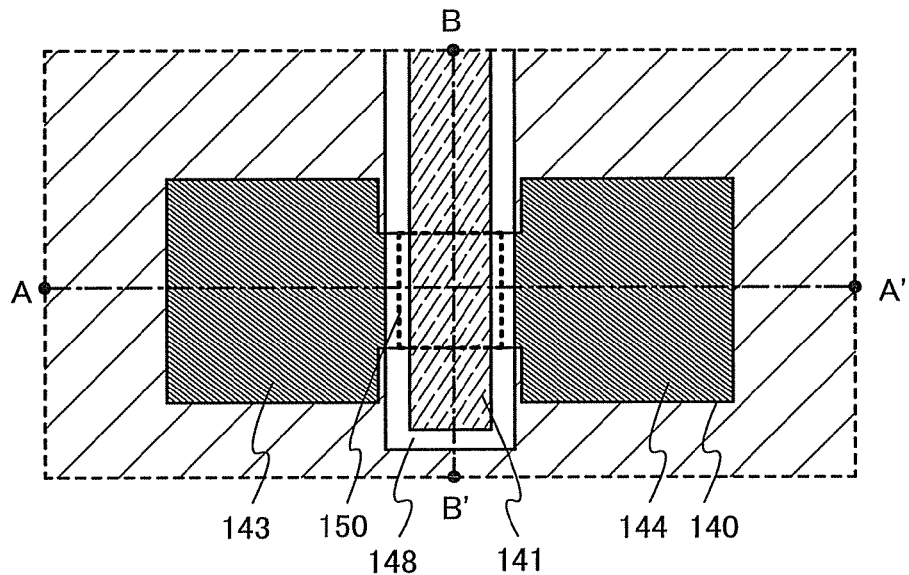
FIG. 3A is a top view illustrating a structure of a transistor included in a semiconductor device of the present invention and FIGS. 3B and 3C are cross-sectional views illustrating the same.
Figure 3B:
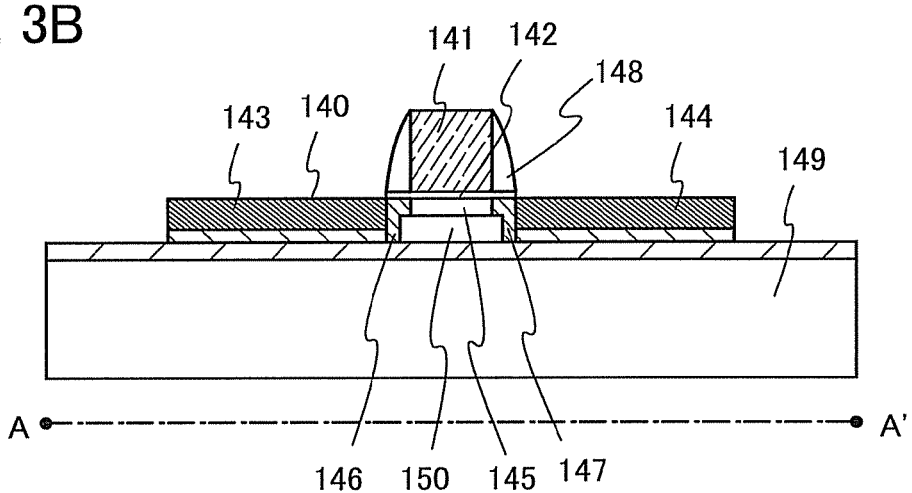
Figure 3C:
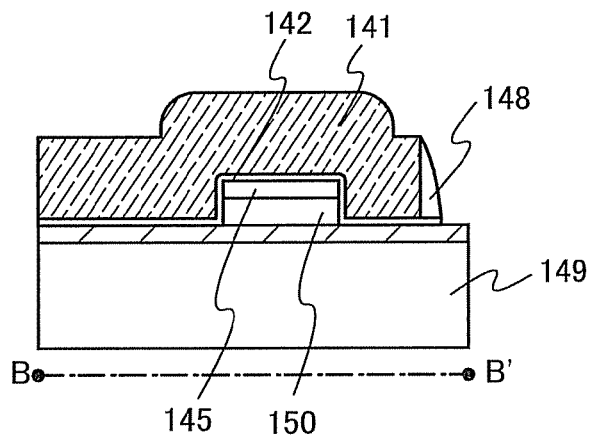

FIG. 3A shows an example of a top view of a transistor included in a semiconductor device of the present invention and FIGS. 3B and 3C each show an example of a cross-sectional view thereof. FIG. 3A is a top view of the transistor, FIG. 3B is a cross-sectional view taken along line A-A' in FIG. 3A, and FIG. 3C is a cross-sectional view taken along line B-B' in FIG. 3A.

The transistor shown in FIGS. 3A to 3C includes a semiconductor film 140 functioning as an active layer, an electrode 141, a portion of which overlapping with the semiconductor film 140 functions as a gate, and a gate insulating film 142 provided between the semiconductor film 140 and the electrode 141. The semiconductor film 140 includes impurity regions 143 and 144, one of which functions as a source and the other as a drain, a channel formation region 145, and LDD (lightly doped drain) regions 146 and 147 provided respectively between the impurity region 143 and the channel formation region 145 and between the impurity region 144 and the channel formation region 145.

A cavity 150 is provided between the semiconductor film 140 and a base substrate 149. The cavity 150 is not fit into a region which overlaps with the semiconductor film 140, but it extends to end portions of the semiconductor film 140. Therefore, unlike the transistor shown in FIGS. 2A and 2B, a recess extends to end portions of the semiconductor film 140; namely, the cavity 150 opens at end portions of the semiconductor film 140. Further, the cavity 150 overlaps with the channel formation region 145 in the semiconductor film 140. In the case where the cavity overlaps with at least the channel formation region 145, self-heating can be further suppressed in comparison with the case of forming the cavity so as to overlap with only the impurity regions 143 and 144. Further, since the cavity 150 opens at end portions of the semiconductor film 140, difference in air pressure between the inside and the outside of the cavity 150 can be reduced. Accordingly, even if the temperature rapidly changes in heat treatment, the semiconductor film 140 can be prevented from being deformed.

Note that, although the semiconductor film 140 of the transistor shown in FIGS. 3A to 3C includes the LDD regions 146 and 147, the present invention is not limited to this structure. The LDD regions 146 and 147 are not necessarily provided, or either one of the LDD region 146 or the LDD region 147 may be provided. In addition, although in the transistor shown in FIGS. 3A to 3C, the LDD regions 146 and 147 are provided in regions other than the region in the semiconductor film 140, which overlaps with the electrode 141, the present invention is not limited to this structure. The LDD regions 146 and 147 may be provided in regions overlapping with the electrode 141. Alternatively, the LDD regions 146 and 147 may be provided so as to extend to the region overlapping with the electrode 141 and a region other than the aforementioned region.

In addition, although a sidewall 148 which is used as a mask when the LDD regions 146 and 147 are formed is provided on sides of the electrode 141 in the transistor shown in FIGS. 3A and 3B, the present invention is not limited to this structure.

Figure 4A:
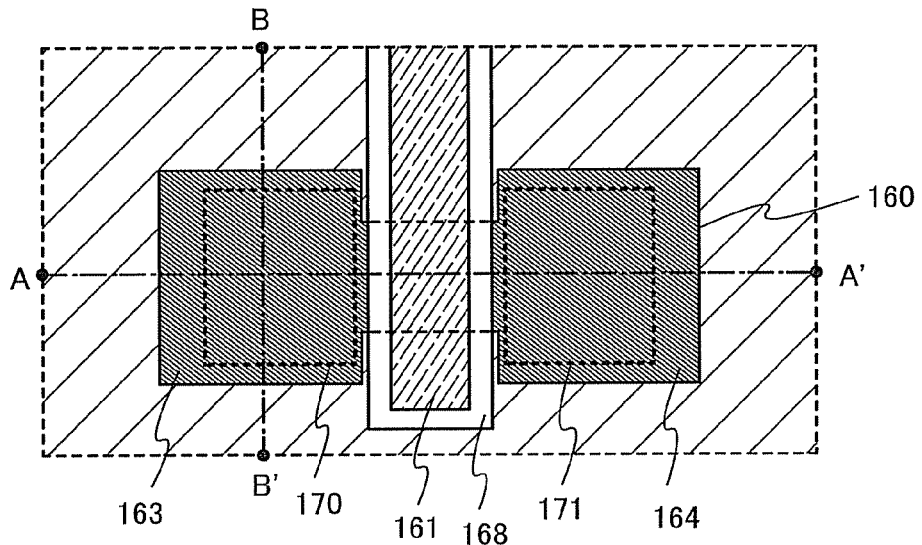
FIG. 4A is a top view illustrating a structure of a transistor included in a semiconductor device of the present invention and FIGS. 4B and 4C are cross-sectional views illustrating the same.
Figure 4B:
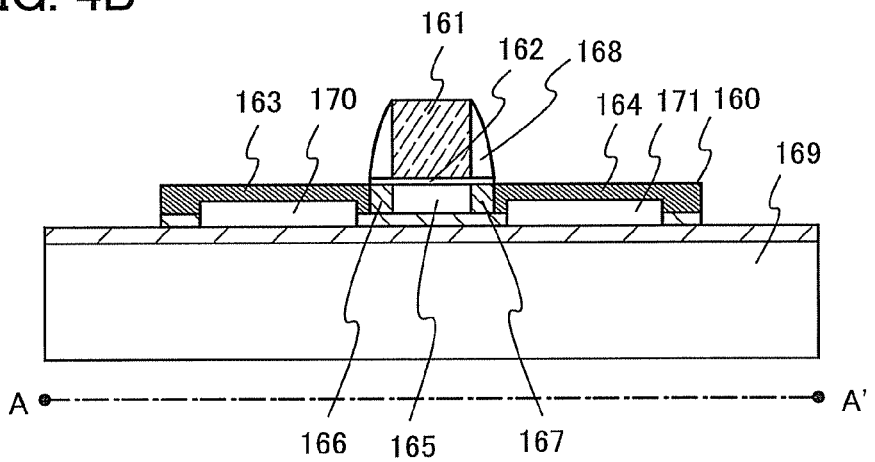
Figure 4C:
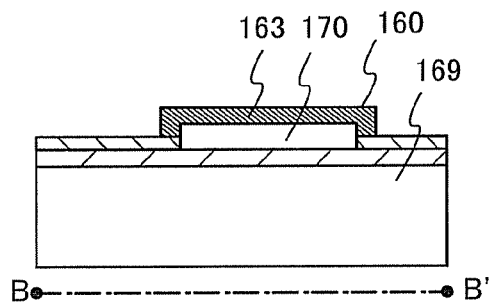

FIG. 4A shows an example of a top view of a transistor included in a semiconductor device of the present invention and FIGS. 4B and 4C each show an example of a cross-sectional view thereof. FIG. 4A is a top view of the transistor, FIG. 4B is a cross-sectional view taken along line A-A' in FIG. 4A, and FIG. 4C is a cross-sectional view taken along line B-B' in FIG. 4A.

The transistor shown in FIGS. 4A to 4C includes a semiconductor film 160 functioning as an active layer, an electrode 161, a portion of which overlapping with the semiconductor film 160 functions as a gate, and a gate insulating film 162 provided between the semiconductor film 160 and the electrode 161. The semiconductor film 160 includes impurity regions 163 and 164, one of which functions as a source and the other as a drain, a channel formation region 165, and LDD (lightly doped drain) regions 166 and 167 provided respectively between the impurity region 163 and the channel formation region 165 and between the impurity region 164 and the channel formation region 165.

Two cavities of a cavity 170 and a cavity 171 are provided between the semiconductor film 160 and the base substrate 169. The cavity 170 and the cavity 171 overlap with the impurity region 163 and the impurity region 164, respectively. Note that the cavity 170 and the cavity 171 may be fit into a region which overlaps with the semiconductor film 160, or may be extended to end portions of the semiconductor film 160 without being fit thereinto, and thereby the recesses may be open at the end portions of the semiconductor film 160. In the case where the cavities 170 and 171 overlap with at least the impurity regions 163 and 164, junction capacitance of the transistor can be further reduced in comparison with the case of forming cavities which overlap with only the channel formation region 165. Further, when the cavities 170 and 171 extend to end portions of the semiconductor film 160, the cavities 170 and 171 open at end portions of the semiconductor film 160; therefore, difference in air pressure between the inside and the outside of the cavities 170 and 171 can be reduced. Accordingly, even if the temperature rapidly changes in heat treatment, the semiconductor film 160 can be prevented from being deformed.

Note that, although the semiconductor film 160 of the transistor shown in FIGS. 4A to 4C includes the LDD regions 166 and the LDD region 167, the present invention is not limited to this structure. The LDD regions 166 and the LDD region 167 are not necessarily provided, or either one of the LDD region 166 or the LDD region 167 may be provided. In addition, although in the transistor shown in FIGS. 4A to 4C, the LDD regions 166 and 167 are provided in regions other than the region overlapping with the electrode 161 in the semiconductor film 160, the present invention is not limited to this structure. The LDD regions 166 and 167 may be provided in regions overlapping with the electrode 161. Alternatively, the LDD regions 166 and 167 may be provided so as to extend to the region overlapping with the electrode 161 and a region other than the aforementioned region.

In addition, although a sidewall 168 which is used as a mask when the LDD regions 166 and 167 are formed is provided on sides of the electrode 161 in the transistor shown in FIGS. 4A and 4B, the present invention is not limited to this structure.

Figure 5A:
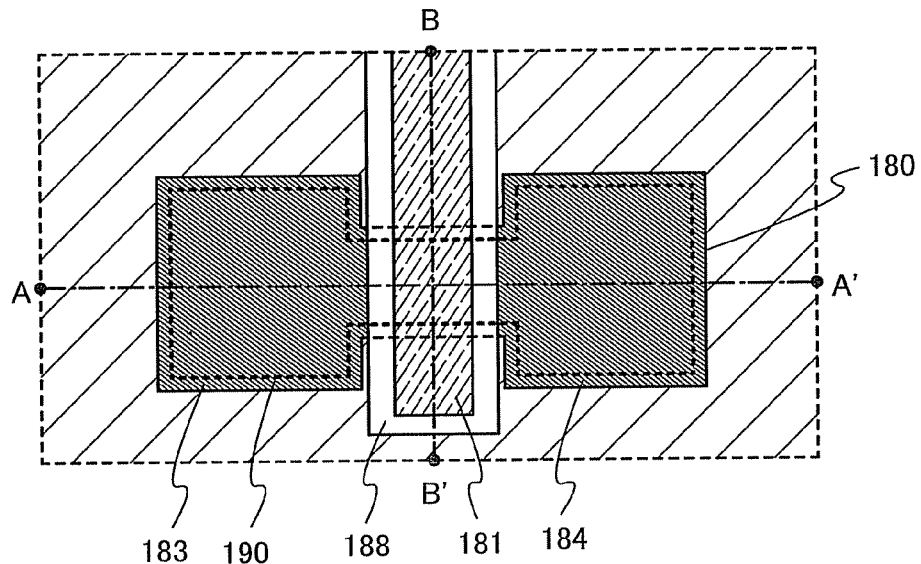
FIG. 5A is a top view illustrating a structure of a transistor included in a semiconductor device of the present invention and FIGS. 5B and 5C are cross-sectional views illustrating the same.
Figure 5B:
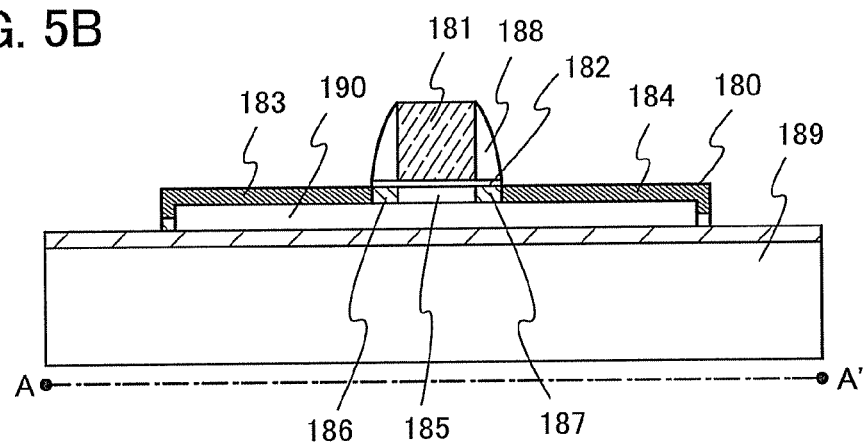
Figure 5C:
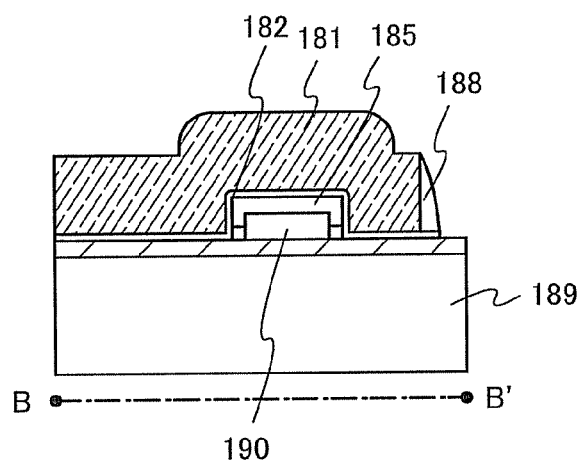

FIG. 5A shows an example of a top view of a transistor included in a semiconductor device of the present invention, and FIGS. 5B and 5C each show an example of a cross-sectional view thereof. FIG. 5A is a top view of the transistor, FIG. 5B is a cross-sectional view taken along line A-A' in FIG. 5A, and FIG. 5C is a cross-sectional view taken along line B-B' in FIG. 5A.

The transistor shown in FIGS. 5A to 5C includes a semiconductor film 180 functioning as an active layer, an electrode 181, a portion of which overlapping with the semiconductor film 180 functions as a gate, and a gate insulating film 182 provided between the semiconductor film 180 and the electrode 181. The semiconductor film 180 includes impurity regions 183 and 184, one of which functions as a source and the other as a drain, a channel formation region 185, and LDD (lightly doped drain) regions 186 and 187 provided respectively between the impurity region 183 and the channel formation region 185 and between the impurity region 184 and the channel formation region 185.

A cavity 190 is provided between the semiconductor film 180 and a base substrate 189. The cavity 190 overlap with the impurity regions 183 and 184 and the channel formation region 185. Note that the cavity 190 may be fit into a region which overlaps with the semiconductor film 180, or may be extended to end portions of the semiconductor film 180 without being fixed thereto, and thereby the recesses may be open at the end portions of the semiconductor film 180. In the case where the cavity 190 overlaps with the impurity regions 183 and 184 and the channel formation region 185, not only can self-heating be suppressed but also junction capacitance of the transistor can be further reduced. Further, when the cavity 190 extends to end portions of the semiconductor film 180, the cavity 190 opens at end portions of the semiconductor film 180; therefore, difference in air pressure between the inside and the outside of the cavity 190 can be reduced. Accordingly, even if the temperature rapidly changes in heat treatment, the semiconductor film 180 can be prevented from being deformed.

Note that, although the semiconductor film 180 of the transistor shown in FIGS. 5A to 5C includes the LDD regions 186 and 187, the present invention is not limited to this structure. The LDD regions 186 and 187 are not necessarily provided, or either one of the LDD region 186 or the LDD region 187 may be provided. In addition, although in the transistor shown in FIGS. 5A to 5C, the LDD regions 186 and 187 are provided in regions other than the region overlapping with the electrode 181 in the semiconductor film 180, the present invention is not limited to this structure. The LDD regions 186 and 187 may be provided in regions overlapping with the electrode 181. Alternatively, the LDD regions 186 and 187 may be provided so as to extend to the region overlapping with the electrode 181 and a region other than the aforementioned region.

In addition, although a sidewall 188 which is used as a mask when the LDD regions 186 and 187 are formed is provided on sides of the electrode 181 in the transistor shown in FIGS. 5A and 5B, the present invention is not limited to this structure.

Figure 6A:
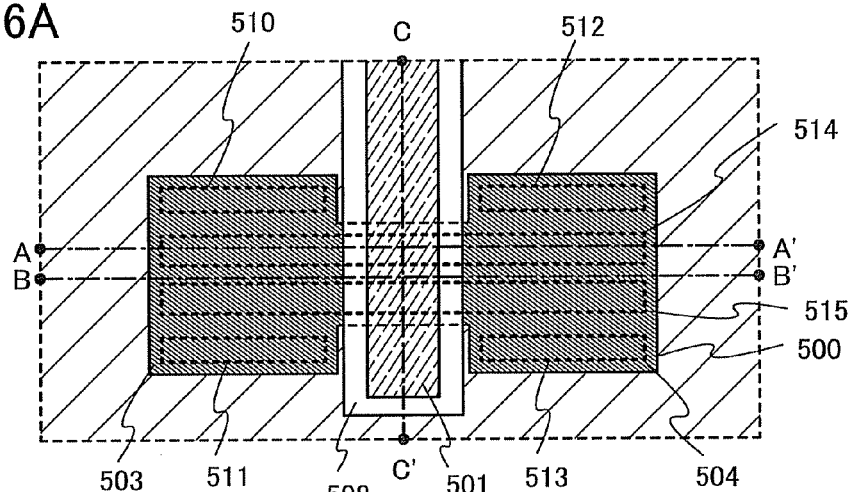
FIGS. 6A to 6D are views illustrating a manufacturing method of a semiconductor device of the present invention.
Figure 6B:
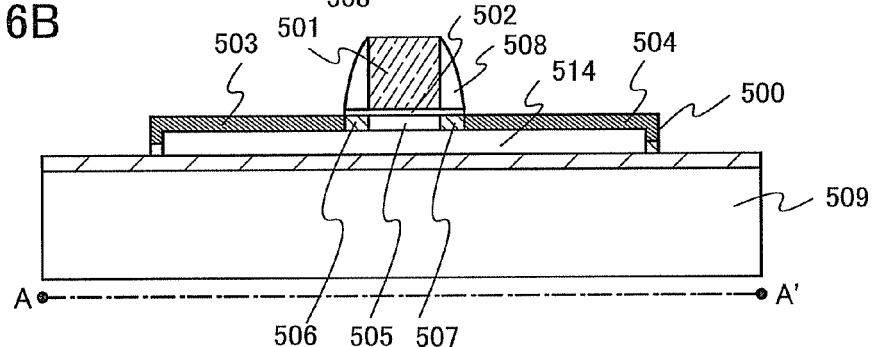
Figure 6C:
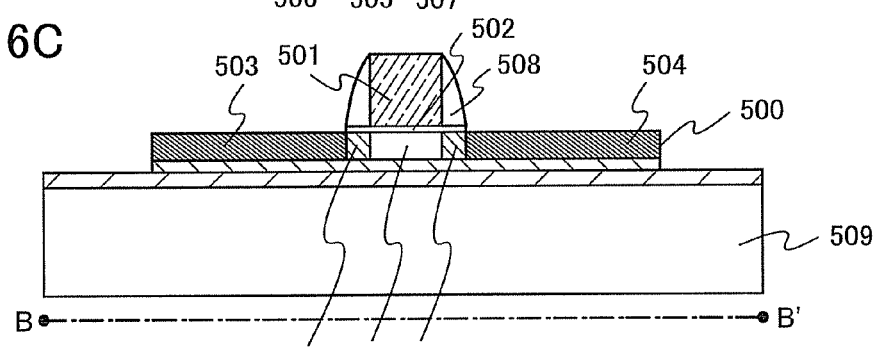
Figure 6D:
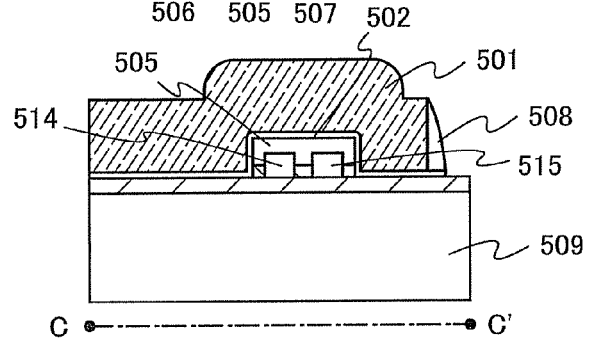

FIG. 6A shows an example of a top view of a transistor included in a semiconductor device of the present invention and FIGS. 6B and 6C each show an example of a cross-sectional view thereof. FIG. 6A is a top view of the transistor, FIG. 6B is a cross-sectional view taken along line A-A' in FIG. 6A, FIG. 6C is a cross-sectional view taken along line B-B' in FIG. 6A, and FIG. 6D is a cross-sectional view taken along line C-C' in FIG. 6A.

The transistor shown in FIGS. 6A to 6C includes a semiconductor film 500 functioning as an active layer, an electrode 501, a portion of which overlapping with the semiconductor film 500 functions as a gate, and a gate insulating film 502 provided between the semiconductor film 500 and the electrode 501. The semiconductor film 500 includes impurity regions 503 and 504, one of which functions as a source and the other as a drain, a channel formation region 505, and LDD (lightly doped drain) regions 506 and 507 provided respectively between the impurity region 503 and the channel formation region 505 and between the impurity region 504 and the channel formation region 505.

A plurality of cavities 510 to 515 are provided between the semiconductor film 500 and a base substrate 509. The cavities 510 and 511 overlap with the impurity region 503 and the cavities 512 and 513 overlap with the impurity region 504. Further, the cavities 514 and 515 overlap with the impurity regions 503 and 504 and the channel formation region 505. Since the cavities 510 to 513 overlap with the impurity regions 503 and 504, self-heating can be reduced. Further, the cavities 514 and 515 overlap with the impurity region 503 and 504 and the channel formation region 505; thus, not only can self-heating be suppressed but also junction capacitance of the transistor can be further reduced.

Note that the cavities 510 to 515 may be fit into a region which overlaps with the semiconductor film 500, or may be extended to end portions of the semiconductor film 500 without being fit thereinto, and thereby the recesses may be open at the end portions of the semiconductor film 500. When the cavities 510 to 515 extend to end portions of the semiconductor film 500, the cavities 510 to 515 open at end portions of the semiconductor film 500; therefore, difference in air pressure between the inside and the outside of the cavities 510 to 515 can be reduced. Accordingly, even if the temperature rapidly changes in heat treatment, the semiconductor film 500 can be prevented from being deformed.

Note that, although the semiconductor film 500 of the transistor shown in FIGS. 6A to 6D includes the LDD regions 506 and the LDD region 507, the present invention is not limited to this structure. The LDD regions 506 and the LDD region 507 are not necessarily provided, or either one of the LDD region 506 or the LDD region 507 may be provided. In addition, although in the transistor shown in FIGS. 6A to 6D, the LDD regions 506 and 507 are provided in regions other than the region overlapping with the electrode 501 in the semiconductor film 500, the present invention is not limited to this structure. The LDD regions 506 and 507 may be provided in regions overlapping with the electrode 501. Alternatively, the LDD regions 506 and 507 may be provided so as to extend to the region overlapping with the electrode 501 and a region other than the aforementioned region.

Although a sidewall 508 which is used as a mask when the LDD regions 506 and 507 are formed is provided on sides of the electrode 501 in the transistor shown in FIGS. 6A to 6B, the present invention is not limited to this structure.

Note that in the case where one cavity is provided under the semiconductor film as shown in FIGS. 5A to 5C, the cavity can be formed so as to have a larger area under the semiconductor film, and thus junction capacitance and parasitic capacitance can be reduced more and self-heating can be suppressed more in the case where a plurality of cavities is provided. On the other hand, in the case where a plurality of cavities is provided under the semiconductor film as shown in FIGS. 6A to 6D, a transistor with higher physical strength than a transistor in the case where one cavity is provided can be formed.

In addition, although only one cavity is provided so as to overlap with the channel formation region in the case of the transistor shown in FIGS. 2A to 2C and FIGS. 3A to 3C, the present invention is not limited to this structure. A plurality of cavities may be provided so as to overlap with the channel formation region. In the case where one cavity is provided, the cavity can be formed so as to have a larger area under the channel formation region, and thus self-heating can be suppressed more than in the case where a plurality of cavities is provided under the channel formation region. On the other hand, in the case where a plurality of cavities is provided under the channel formation region, a transistor with higher physical strength than a transistor in the case where one cavity is provided can be formed.

In addition, although two cavities which overlap with respective impurity regions are provided in the case of the transistor shown in FIGS. 4A to 4C, the present invention is not limited to this structure. A plurality of cavities which overlap with one impurity region may be provided. In the case where one cavity which overlaps with one impurity region is provided, the cavity can be formed so as to have a larger area under the impurity region, and thus self-heating can be suppressed more than in the case where a plurality of cavities is provided. On the other hand, in the case where a plurality of cavities is provided under one impurity region, a transistor with higher physical strength than a transistor in the case where one cavity is provided can be formed.

This embodiment can be implemented in combination with any of the embodiment modes as appropriate.

Embodiment Mode 3

In this embodiment mode, a manufacturing method of a semiconductor device of the present invention, in which a semiconductor film is transferred from a semiconductor substrate (a bond substrate) to a supporting substrate (a base substrate) having been processed into a desired shape is formed will be described.

Figure 7A:
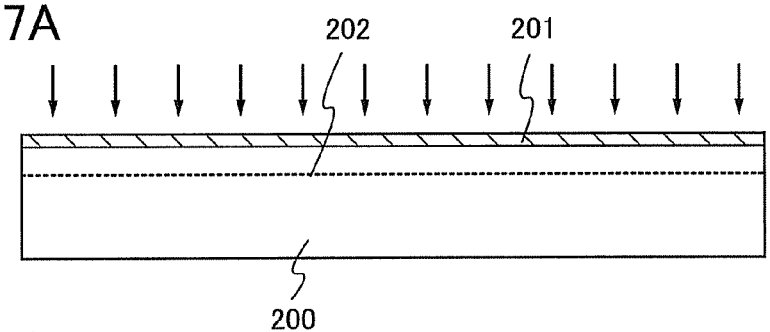
FIGS. 7A to 7D are views illustrating a manufacturing method of a semiconductor device of the present invention.

First, as shown in FIG. 7A, a bond substrate 200 on which an insulating film 201 is formed is prepared. The insulating film 201 is formed using an insulating material such as silicon oxide, silicon nitride oxide, or silicon nitride. Since the thickness of the insulating film 201 influences the depth of a defect layer 202 which is to be formed later, the thickness of the insulating film 201 is desirably uniform. For example, in the case of using silicon oxide for the insulating film 201, the insulating film 201 is desirably formed by thermal oxidation of the bond substrate 200. For example, the insulating film 201 is preferably formed by heat treatment at 900° C. to 1100° C. in a water vapor atmosphere. Alternatively, the insulating film 201 may be formed by oxidation of the bond substrate 200 with oxygen plasma treatment. In addition, in the case of using silicon oxide for the insulating film 201, the insulating film 201 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 201 may be densified with oxygen plasma treatment.

Alternatively, the insulating film 201 may be formed using silicon oxide which is formed with the use of an organic silane gas by a chemical vapor deposition method. As the silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

The insulating film 201 may be a single-layer insulating film or a layer in which a plurality of insulating films is stacked. For example, in this embodiment mode, the insulating film 201 is used in which, from the bond substrate 200 side, silicon oxynitride in which the amount of oxygen is higher than that of nitrogen, silicon nitride oxide in which the amount of nitrogen is higher than that of oxygen, and silicon oxide formed using an organic silane gas by a chemical vapor deposition method are stacked.

In the case of using silicon nitride for the insulating film 201, the insulating film 201 can be formed using a mixed gas of silane and ammonium by a vapor deposition method such as plasma CVD. In addition, in the case of using silicon nitride oxide for the insulating film 201, the insulating film 201 can be formed using a mixed gas of silane and ammonium or a mixed gas of silane and nitrogen oxide by a vapor deposition method such as plasma CVD.

Note that, in some cases, in a step of removing the semiconductor film from the bond substrate 200, hydrogen or a noble gas, or hydrogen ions or noble gas ions is introduced into the bond substrate 200 at high concentration, and accordingly a surface of the bond substrate 200 becomes rough and sufficient bond strength for attachment with the base substrate cannot be obtained. The insulating film 201 is provided, whereby the surface of the bond substrate 200 is protected at the time of the introduction of hydrogen or a noble gas, or hydrogen ions or noble gas ions, and the base substrate and the bond substrate 200 can be firmly attached to each other.

Next, hydrogen or a noble gas, or hydrogen ions or noble gas ions is introduced into the bond substrate 200 as indicated by arrows, whereby the defect layer 202 having very small voids is formed in a region at a certain depth from a surface of the bond substrate 200. The position where the defect layer 202 is formed is determined depending on acceleration voltage at the time of the above-described introduction. The thickness of a semiconductor film 207 which is transferred from the bond substrate 200 to the base substrate is determined by the position of the defect layer 202; therefore, acceleration of the voltage at the time of the introduction is performed in consideration of the thickness of the semiconductor film. The semiconductor film 207 is formed to a thickness of 10 nm to 200 nm, preferably 10 nm to 50 nm. For example, in the case where hydrogen is introduced into the bond substrate 200, the dose is desirably $1 \times 10^{16}/cm^2$ to $1 \times 10^{17}/cm^2$.

Figure 7B:
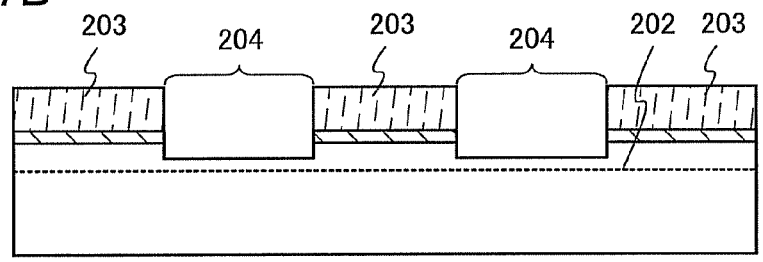

Next, as shown in FIG. 7B, an insulating film 201 formed over the bond substrate 200 is processed (patterned) into a desired shape, and thereby the insulating film 201 is partially removed to form recesses 204. In addition, the recesses 204 are formed in the region in bond substrate 200, where the insulating film 201 is partially removed. Specifically, patterning can be performed in such a manner that the bond substrate 200 and the insulating film 201 are etched using a mask 203 formed of resist. The recesses 204 correspond to cavities which are to be formed between a semiconductor film of a transistor and a base substrate. Therefore, the recesses 204 are formed in consideration of the shape of the semiconductor film of the transistor. The recesses 204 are formed to have a depth such that the recesses are above the position where the defect layer 202 is formed. Note that the bond substrate 200 may be processed (patterned) into a desired shape using an inorganic insulating film as a hard mask instead of using a resist.

The etching may be performed using a dry etching method, for example, reactive ion etching (RIE), ICP (Inductively Coupled Plasma) etching, ECR (Electron Cyclotron Resonance) etching, parallel plate (Capacitive Coupled Plasma) etching, magnetron plasma etching, dual-frequency plasma etching, helicon wave plasma etching, or the like.

For example, when ICP etching is used, etching may be performed under the following conditions: the flow rate of chlorine, which is an etching gas: 40 sccm to 100 sccm; power applied to a coil electrode: 100 W to 200 W; the temperature of a lower electrode (on the bias side): 40 W to 100 W; and the reaction pressure: 0.5 Pa to 1.0 Pa. In this embodiment mode, etching is performed under the following conditions: the flow rate of chlorine, which is an etching gas: 100 sccm, the reaction pressure: 1.0 Pa, the temperature of the lower electrode: 70° C., RF (13.56 MHz) power applied to the coil electrode: 150 W, power applied to the lower electrode (on the bias side): 40 W, and thereby recesses 204 are formed to have a depth of approximately 5 nm to 190 nm, preferably 20 nm to 150 nm in the bond substrate 200. For the etching gas, a chloride gas such as chlorine, boron chloride, silicon chloride or carbon tetrachloride; a fluoride gas such as carbon tetrafluoride, sulfur fluoride, or nitrogen fluoride; or oxygen is used as appropriate.

Note that etching may be performed in addition to the above etching under conditions such that damage on the bond substrate 200 can be reduced. For example, the etching is performed by approximately several nm under the conditions: the flow rate of chlorine, which is an etching gas 100 sccm, reaction pressure 0.67 Pa, the temperature of a lower electrode: 0° C.; RF (13.56 MHz) power applied to a coiled electrode: 2000 W; power applied to the lower electrode (on the bias side): 0 W; and etching time: 30 seconds. Note that the etching gas used for the etching is not limited to chlorine, and for example, water, hydrogen, ammonia, or the like may be used. Plasma damage inflicted on the recesses 204 which are formed in the bond substrate 200 can be repaired by the etching. Repairing of the plasma damage makes it possible to reduce decrease in the lifetime of carriers, and to reduce leakage current of the transistor in an off-state, namely, to improve off properties. Further, the threshold voltage of the transistor can be prevented from being deviated due to plasma.

Further, instead of dry etching, wet etching can be used to form the recesses 204. For example, in the case where the insulating film 201 is formed of silicon oxide, silicon oxynitride, or silicon nitride oxide, etching is performed partially using aqueous hydrofluoric acid. Next, the recesses 204 may be formed by partially etching the bond substrate 200 using a tetraethylammonium hydroxide (tetramethylammonium hydroxide, abbreviated to TMAH) solution.

Note that after forming the recesses 204, before bonding the bond substrate 200 and the base substrate 205, the bond substrate 200 may be hydrogenated. The hydrogenation is performed for example, at 350° C. in a hydrogen atmosphere for approximately two hours.

Figure 7C:
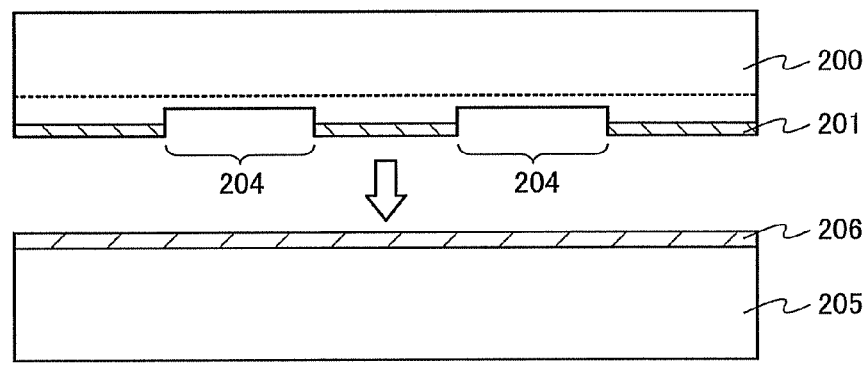

After removing the mask 203, as shown in FIG. 7C, the bond substrate 200 provided with the recesses 204 is bonded to the base substrate 205. The bond substrate 200 and the base substrate 205 are bonded so that the recesses 204 open toward the bond substrate 200. An insulating film 206 is formed on the surface of the base substrate 205 in order to improve the bond strength between the bond substrate 200 and the base substrate 205. The insulating film 206, so that the insulating film 201 formed on the bond substrate 200 and the insulating film 206 are attached to one another, and thereby the bond substrate 200 and the base substrate 205 are bonded to each other.

The bond substrate 200 and the base substrate 205 are bonded to each other by van der Waals forces, so that they are firmly attached to each other at room temperature. Note that since the above-described attachment can be performed at a low temperature, various substrates can be used for the base substrate 205. As the base substrate 205, for example, a substrate such as a quartz substrate or a sapphire substrate can be used as well as a glass substrate made of aluminosilicate glass, barium borosilicate glass, aluminoborosilicate glass, or the like. Furthermore, as the base substrate 205, a semiconductor substrate formed of silicon, gallium arsenide, indium phosphide, or the like can be used.

As the bond substrate 200, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 200. In addition, as the bond substrate 200, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that heat treatment or pressure treatment may be performed after the base substrate 205 and the bond substrate 200 are bonded to each other. The bond strength can be increased with heat treatment or pressure treatment.

The insulating film 206 can be formed using silicon oxide or silicon nitride oxide. In the case where silicon nitride oxide is used for the insulating film 206, the silicon nitride oxide desirably contains more carbon than oxygen, specifically, it desirably contains oxygen at 55 atomic % to 65 atomic %, nitrogen at 1 atomic % to 20 atomic %, silicon at 25 atomic % to 35 atomic %, and hydrogen at 0.1 atomic % to 10 atomic %. Note that in the case where a semiconductor substrate is used as the base substrate 205, the insulating film 206 can be formed by thermally oxidizing the base substrate 205.

Note that a silicon nitride film may be provided between the insulating film 206 and the base substrate 205. When the silicon nitride film is provided between the insulating film 206 and the base substrate 205, an alkali metal such as sodium or an alkaline earth metal is diffused into the bond substrate 200, thereby precluding adverse effects on characteristics of semiconductor elements such as a transistor, which are to be formed later. Further, in order to prevent diffusion of impurities, instead of the silicon nitride film, a silicon nitride oxide film containing nitrogen than oxygen, which has composition containing oxygen at 15 atomic % to 30 atomic %, nitrogen at 20 atomic % to 35 atomic %, silicon at 25 atomic % to 35 atomic %, and hydrogen at 15 atomic % to 25 atomic %. Alternatively, aluminum nitride, aluminum nitride oxide or the like may be used to prevent diffusion of impurities.

Figure 7D:
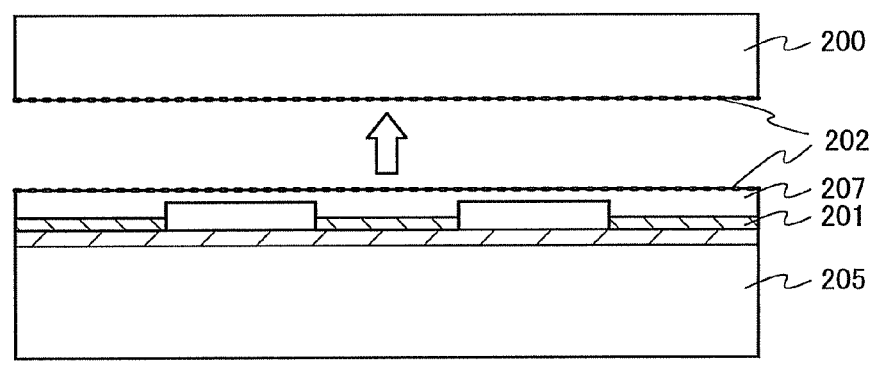

Heat treatment is performed after the bond substrate 200 and the base substrate 205 are attached to each other, and thereby the adjacent microvoids in the defect layer 202 are coupled, and the volume of the microvoid is increased. As a result, as shown in FIG. 7D, the bond substrate 200 is split along the defect layer 202; thus, the insulating film 201 and the semiconductor film 207 which has been part of the bond substrate 200 are separated from the bond substrate 200. The heat treatment is preferably performed at a temperature that is equal to or lower than the allowable temperature limit of the bond substrate 200. For example, heat treatment may be performed at a temperature ranging from 400° C. to 600° C. After the separation, the semiconductor film 207 and the insulating film 201 are transferred to the base substrate 205. After that, heat treatment at a temperature ranging from 400° C. to 600° C. is preferably performed in order to make stronger the attachment between the insulating film 201 and the insulating film 206.

Crystal plane orientation of the semiconductor film 207 can be controlled with the plane orientation of the bond substrate 200. The bond substrate 200 having crystal plane orientation which is suitable for a semiconductor element which is to be formed may be selected as appropriate. The mobility of the transistor depends on the crystal plane orientation of the semiconductor film 207. In order to obtain a transistor with higher mobility, the direction of bonding the bond substrate 200 is set in consideration of the direction of a channel and the crystal plane orientation.

Figure 8A:
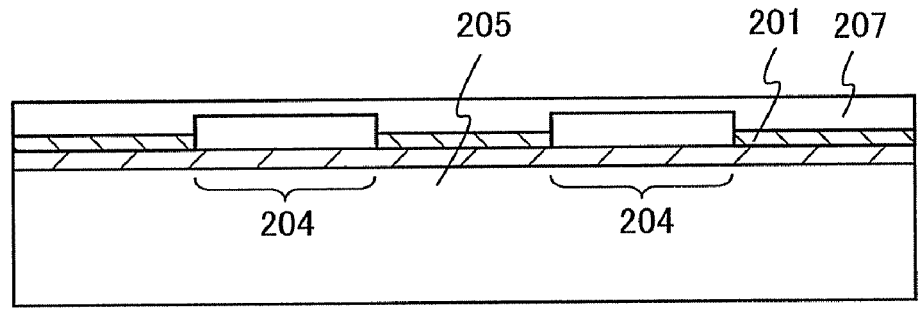
FIGS. 8A to 8C are views illustrating a manufacturing method of a semiconductor device of the present invention.

Next, as shown in FIG. 8A, a surface of the transferred semiconductor film 207 is planarized. Although the planarization is not necessarily essential, the planarization makes it possible to improve characteristics of the interface between the semiconductor film 207 and a gate insulating film in the transistor which is to be formed later. Specifically, the planarization can be performed by chemical mechanical polishing (CMP), liquid jet polishing, or the like. The thickness of the semiconductor film 207 is reduced by the above-described planarization.

Note that, although the case where a Smart Cut (registered trademark) method is used in which the semiconductor film 207 is separated from the bond substrate 200 using the defect layer 202 is used is described in this embodiment mode, the semiconductor film 207 may be bonded to the base substrate 205 by another bonding method such as ELTRAN (epitaxial layer transfer), a dielectric isolation method, or a PACE (plasma assisted chemical etching) method.

Figure 8B:
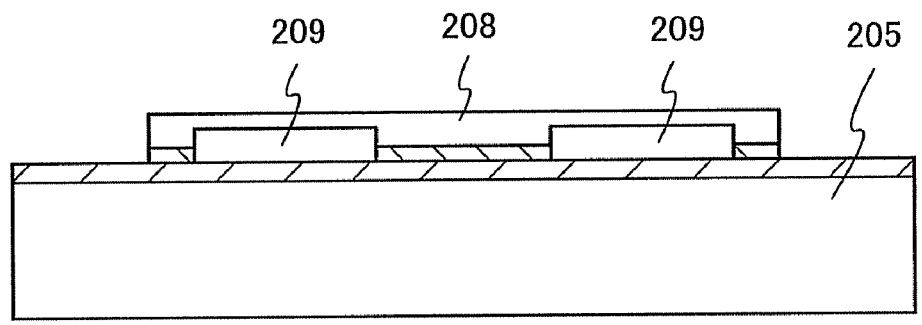

Next, as shown in FIG. 8B, the semiconductor film 207 is patterned, whereby an island-shaped semiconductor film 208 is formed. The patterning of the insulating film 201 may be performed using the mask used for patterning the semiconductor film 207. A pair of cavities 209 formed by the recesses 204 is provided between the island-shaped semiconductor film 208 and the base substrate 205.

Figure 8C:
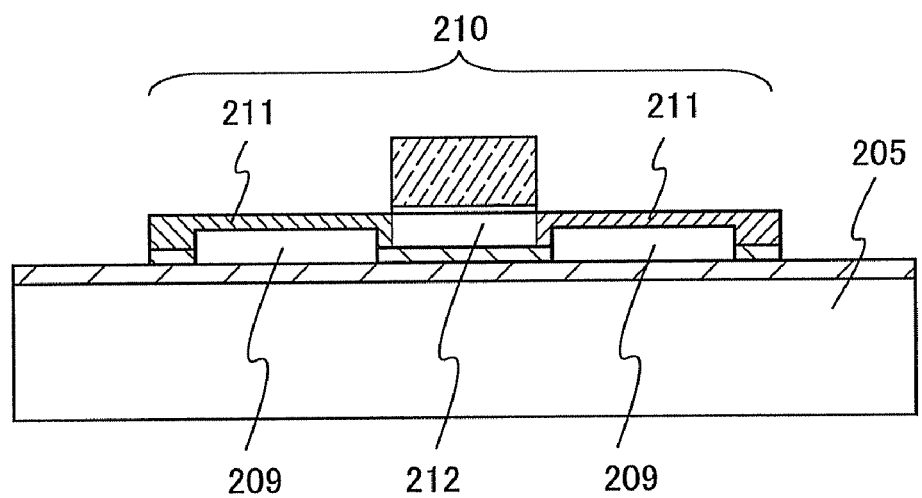

The present invention makes it possible to form various semiconductor elements such as transistors with the use of the semiconductor film 208 which is formed through the above-described steps. A transistor 210 formed using the semiconductor film 208 is shown in FIG. 8C as an example.

In the manufacturing method of the present invention, the recesses 204 are formed by etching; thus, the cavities 209 with a desired depth and a desired shape can be formed precisely through a simple procedure.

In addition, in the manufactured transistor 210, the cavities 209 are included between the semiconductor film 208 and the base substrate 205, and the cavities 209 are in contact with the semiconductor film 208. Thus, when the cavities 209 are filled with air, nitrogen, an inert gas, or the like that has lower relative permittivity than an inorganic insulating film of silicon oxide or the like, parasitic capacitance or junction capacitance of the transistor 210 can be reduced. It is desirable that the percentage of moisture contained in the above-described gas be decreased in order to suppress volume expansion with temperature change. Note that, in fact, a natural oxide film is formed, in some cases, in a portion of the semiconductor film 208, which is in contact with the cavities 209. However, the insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor 210 can be reduced more in the present invention than in the case where the insulating film is formed to the above-described thickness in the portion of the semiconductor film 208, which is in contact with the cavities.

Note that, although the case where the cavities 209 are filled with gas such as air is described in this embodiment mode, the present invention is not limited to this structure. For example, the cavities 209 may be filled with a material other than gas that has lower relative permittivity than an inorganic insulating film of silicon oxide or the like, for example, a porous insulating film (a porous material) including a large number of pores therein.

In addition, although the structure in which two cavities 209 are provided between the island-shaped semiconductor film 208 and the base substrate 205 is described in this embodiment, the present invention is not limited to this structure. One cavity 209 may be provided, or three or more cavities 209 may be provided. Moreover, although in this embodiment mode, the cavities 209 are formed so as to overlap with impurity regions 211, one of which functions as a source and the other as a drain, the present invention is not limited to this structure. The cavity 209 may be formed so as to overlap with a channel formation region 212 in the semiconductor film 208, or the cavity 209 may be formed so as to overlap with a pair of the impurity regions 211 and the channel formation region 212.

Note that, junction capacitance can be reduced more in the case of forming the cavity 209 overlaps with at least the impurity regions 211 than in the case of forming the cavity 209 which overlaps with only the channel formation region 212. On the other hand, self-heating can be suppressed more in the case where the cavity 209 which overlaps with at least the channel formation region 212 is formed than in the case where the cavity 209 which overlaps with only the impurity regions 211 is formed.

This embodiment can be implemented in combination with any of the embodiment modes as appropriate.

Embodiment Mode 4

In this embodiment mode, a manufacturing method of a semiconductor device of the present invention will be described, in which a semiconductor film in which a region to be an island-shaped semiconductor film later is formed in advance in a semiconductor substrate (a bond substrate) is transferred from the semiconductor substrate (a bond substrate) to a supporting substrate (a base substrate).

Figure 9A:
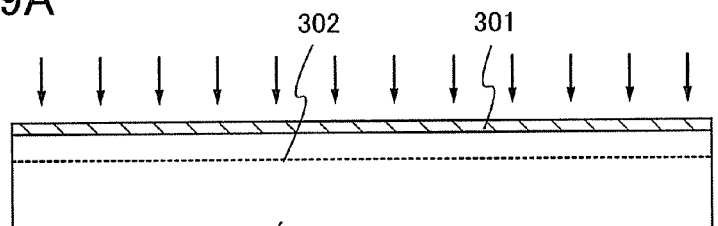
FIGS. 9A to 9D are views illustrating a manufacturing method of a semiconductor device of the present invention.

First, as shown in FIG. 9A, a bond substrate 300 on which an insulating film 301 is formed is prepared. The insulating film 301 is formed using an insulating material such as silicon oxide, silicon nitride oxide, or silicon nitride. Since the thickness of the insulating film 301 influences the depth of a defect layer 302 which is to be formed later, the thickness of the insulating film 301 is desirably uniform. For example, in the case of using silicon oxide for the insulating film 301, the insulating film 301 is desirably formed by thermal oxidation of the bond substrate 300. For example, the insulating film 301 is preferably formed by heat treatment at 900° C. to 1100° C. in a water vapor atmosphere. Alternatively, the insulating film 301 may be formed by oxidizing the bond substrate 300 with oxygen plasma treatment. In addition, in the case of using silicon oxide for the insulating film 301, the insulating film 301 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 301 may be densified with oxygen plasma treatment.

Alternatively, the insulating film 301 may be formed using silicon oxide which is formed with the use of an organic silane gas by a chemical vapor deposition method. As the silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethyaminosilane ($SiH(N(CH_3)_2)_3$).

The insulating film 301 may be a single-layer insulating film or a layer in which a plurality of insulating films is stacked. For example, in this embodiment mode, the insulating film 301 is used in which, from the bond substrate 300 side, silicon oxynitride in which the amount of oxygen is higher than that of nitrogen, silicon nitride oxide in which the amount of nitrogen is higher than that of oxygen, and silicon oxide formed using an organic silane gas by a chemical vapor deposition method are stacked.

In the case of using silicon nitride for the insulating film 301, the insulating film 301 can be formed using a mixed gas of silane and ammonium by a vapor deposition method such as plasma CVD. In addition, in the case of using silicon nitride oxide for the insulating film 301, the insulating film 301 can be formed using a mixed gas of silane and ammonium or a mixed gas of silane and nitrogen oxide by a vapor deposition method such as plasma CVD.

Note that, in some cases, in a step of removing a semiconductor film from the bond substrate 300, hydrogen ions are introduced into the bond substrate 300 at high dose, and accordingly a surface of the bond substrate 300 becomes rough and sufficient bond strength for attachment with the base substrate would not be obtained. The insulating film 301 is provided, so that the surface of the bond substrate 300 is protected at the time of introducing hydrogen ions, and the base substrate and the bond substrate 300 can be firmly attached to each other.

Next, hydrogen or a noble gas, or hydrogen ions or noble gas ions is introduced into the bond substrate 300 as indicated by the arrows, whereby the defect layer 302 having very small voids is formed in a region at a certain depth from a surface of the bond substrate 300. The position where the defect layer 302 is formed is determined depending on acceleration voltage at the time of the above-described introduction. The thickness of a semiconductor film 310 which is transferred from the bond substrate 300 to the base substrate is determined by the position of the defect layer 302; therefore, acceleration of the voltage at the time of the introduction is performed in consideration of the thickness of the semiconductor film. The semiconductor film 310 is formed to a thickness of 10 nm to 200 nm, preferably 10 nm to 50 nm. For example, in the case where hydrogen is introduced into the bond substrate 300, the dose is desirably $1\times10^{16}/cm^2$ to $1\times10^{17}/cm^2$.

Figure 9B:
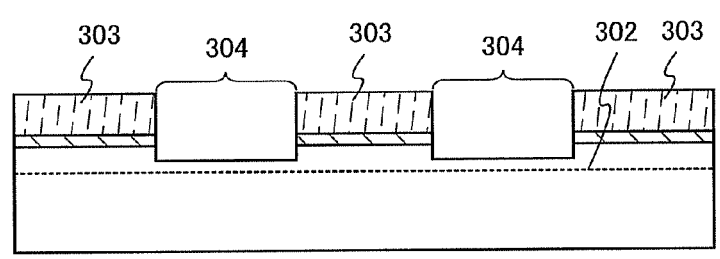

Next, as shown in FIG. 9B, an insulating film 301 formed over the bond substrate 300 is processed (patterned) into a desired shape, and thereby the insulating film 301 is partially removed to form recesses 304. In addition, the recesses 304 are formed in the region in bond substrate 300, where the insulating film 301 is partially removed. Specifically, patterning can be performed in such a manner that the bond substrate 300 and the insulating film 301 are etched using a mask 303 formed of resist. The recesses 304 correspond to cavities which are to be formed between a semiconductor film of a transistor and a base substrate. Therefore, the recesses 304 are formed in consideration of the shape of the semiconductor film of the transistor. The recesses 304 are formed to have a depth such that the recesses are above the position where the defect layer 302. Note that the bond substrate 300 may be processed (patterned) into a desired shape using an inorganic insulating film as a hard mask instead of using a resist.

The etching may be performed using a dry etching method, for example, reactive ion etching (RIE), ICP (Inductively Coupled Plasma) etching, ECR (Electron Cyclotron Resonance) etching, parallel plate (Capacitive Coupled Plasma) etching, magnetron plasma etching, dual-frequency plasma etching, helicon wave plasma etching, or the like.

For example, when ICP etching used, etching may be performed under the following conditions: the flow rate of chlorine, which is an etching gas: 40 sccm to 100 sccm; power applied to a coil electrode: 100 W to 200 W; the temperature of a lower electrode (on the bias side): 40 W to 100 W; and the reaction pressure: 0.5 Pa to 1.0 Pa. In this embodiment mode, etching is performed under the following conditions: the flow rate of chlorine, which is an etching gas: 100 sccm, the reaction pressure: 1.0 Pa, the temperature of the lower electrode: 70° C., RF (13.56 MHz) power applied to the coil electrode: 150 W, power applied to the lower electrode (on the bias side): 40 W, and thereby recesses 304 are formed to have a depth of approximately 5 nm to 190 mM, preferably 20 nm to 150 nm in the bond substrate 300. For the etching gas, a chloride gas such as chlorine, boron chloride, silicon chloride or carbon tetrachloride; a fluoride gas such as carbon tetrafluoride, sulfur fluoride, or nitrogen fluoride; or oxygen is used as appropriate.

Note that etching may be performed in addition to the above etching under conditions such that damage on the bond substrate 300 can be reduced. For example, the etching is performed by approximately several nm under the conditions: the flow rate of chlorine, which is an etching gas 100 sccm, reaction pressure 0.67 Pa, the temperature of a lower electrode: 0° C.; RF (13.56 MHz) power applied to a coiled electrode: 2000 W; power applied to the lower electrode (on the bias side): 0 W; and etching time: 30 seconds. Note that the etching gas used for the etching is not limited to chlorine, and for example, water, hydrogen, ammonia, or the like may be used. Plasma damage inflicted on the recesses 304 which are formed in the bond substrate 300 can be repaired by the etching. Repairing of the plasma damage makes it possible to reduce decrease in the lifetime of carriers, and to reduce leakage current of the transistor in an off-state, namely, to improve off properties. Further, the threshold voltage of the transistor can be prevented from being deviated due to plasma.

Further, instead of dry etching, wet etching can be used to form the recesses 304. For example, in the case where the insulating film 301 is formed of silicon oxide, silicon oxynitride, or silicon nitride oxide, etching is performed partially using aqueous hydrofluoric acid. Next, the recesses 304 may be formed by partially etching the bond substrate 300 using a tetraethylammonium hydroxide (tetramethylammonium hydroxide, abbreviated to TMAH) solution.

Figure 9C:
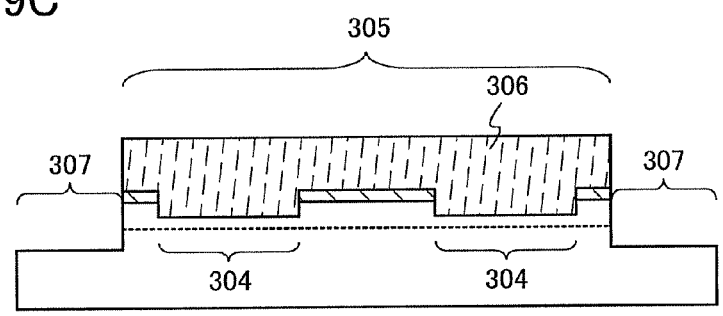

After the mask 303 is removed, as shown in FIG. 9C, the bond substrate 300 and the insulating film 301 are patterned again, and thereby the insulating film 301 is partially removed and a projection 305 is formed in a region where the insulating film 301 partially remains, over the bond substrate 300. Specifically, patterning can be performed in such a manner that the bond substrate 300 and the insulating film 301 are etched using a mask 306 formed of resist. The projection 305 corresponds to a region later to be an island-shaped semiconductor film. Accordingly, the projection 305 is formed in consideration of the shape of the semiconductor film of the transistor. Further, the region in which the projection 305 is formed includes regions where the recesses 304 are formed.

The recesses 307 other than the projection 305 are formed to have a depth such that the recesses are above the position where the defect layer 302. Note that the bond substrate 300 may be processed (patterned) into a desired shape using an inorganic insulating film as a hard mask instead of using a resist.

Note that in this embodiment mode, the projection 305 is formed after forming the recess 304; however, the recesses 304 may be formed after forming the projection 305.

Note that after forming the recesses 304 and the projection 305, before bonding the bond substrate 300 and the base substrate 308, the bond substrate 300 may be hydrogenated. The hydrogenation is performed for example, at 350° C. in a hydrogen atmosphere for approximately two hours.

Figure 9D:
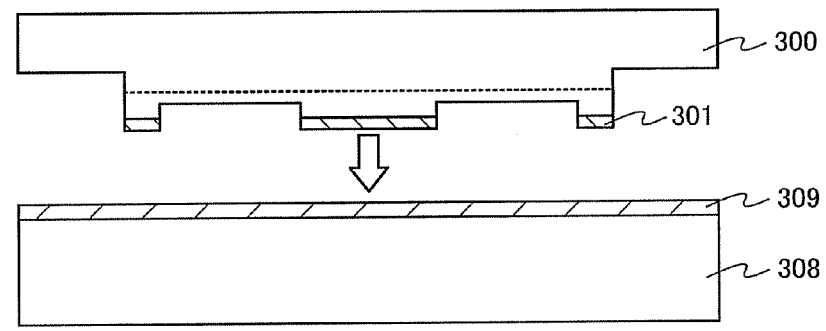

Next, after removing the mask 306, as shown in FIG. 9D, the bond substrate 300 provided with the recesses 304 is bonded to the base substrate 308. The bond substrate 300 and the base substrate 308 are bonded so that the recesses 304 and the projection 305 open toward the base substrate 308. An insulating film 309 is formed on the surface of the base substrate 308 in order to improve the bond strength between the bond substrate 300 and the base substrate 308. The insulating film 309, so that the insulating film 301 formed on the bond substrate 300 and the insulating film 309 bonded, and thereby the bond substrate 300 and the base substrate 308 are attached to each other.

The bond substrate 300 and the base substrate 308 are attached to each other by van der Waals forces, so that they are firmly attached to each other at room temperature. Note that since the above-described attachment can be performed at a low temperature, various substrates can be used for the base substrate 308. As the base substrate 308, for example, a substrate such as a quartz substrate or a sapphire substrate can be used as well as a glass substrate made of aluminosilicate glass, barium borosilicate glass, aluminoborosilicate glass, or the like. Furthermore, as the base substrate 308, a semiconductor substrate formed of silicon, gallium arsenide, indium phosphide, or the like can be used.

As the bond substrate 300, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 300. In addition, as the bond substrate 300, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that heat treatment or pressure treatment may be performed after the base substrate 308 and the bond substrate 300 are bonded to each other. The bond strength can be increased with heat treatment or pressure treatment.

The insulating film 309 can be formed using silicon oxide or silicon nitride oxide. In the case where silicon nitride oxide is used for the insulating film 309, the silicon nitride oxide desirably contains more carbon than oxygen, specifically, it desirably contains oxygen at 55 atomic % to 65 atomic %, nitrogen at 1 atomic % to 20 atomic %, silicon at 25 atomic % to 35 atomic %, and hydrogen at 0.1 atomic % to 10 atomic %. Note that in the case where a semiconductor substrate is used as the base substrate 308, the insulating film 309 can be formed by thermally oxidizing the base substrate 308.

Note that a silicon nitride film may be provided between the insulating film 309 and the base substrate 308. When the silicon nitride film is provided between the insulating film 309 and the base substrate 308, an alkali metal such as sodium or an alkaline earth metal is diffused into the bond substrate 300, thereby precluding adverse effects on characteristics of semiconductor elements such as a transistor, which are to be formed later. Further, in order to prevent diffusion of impurities, instead of the silicon nitride film, a silicon nitride oxide film containing nitrogen than oxygen, which has composition containing oxygen at 15 atomic % to 30 atomic %, nitrogen at 20 atomic % to 35 atomic %, silicon at 25 atomic % to 35 atomic %, and hydrogen at 15 atomic % to 25 atomic %. Alternatively, aluminum nitride, aluminum nitride oxide or the like may be used to prevent diffusion of impurities.

Figure 10A:
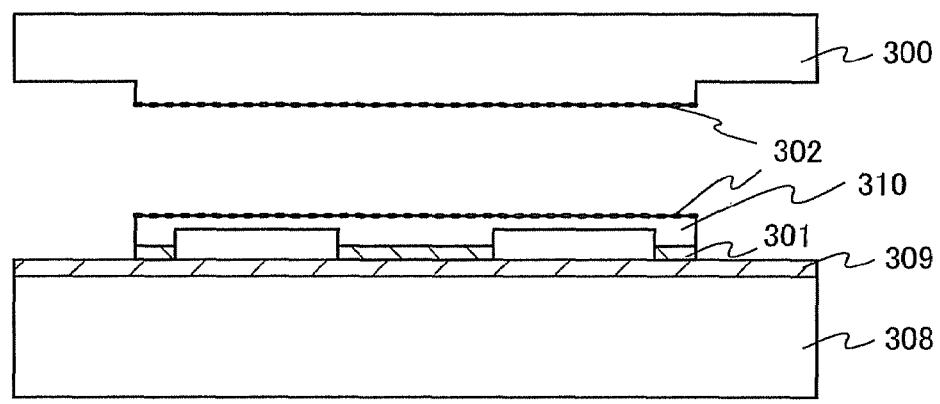
FIGS. 10A and 10B are views illustrating a manufacturing method of a semiconductor device of the present invention.

Heat treatment is performed after the bond substrate 300 and the base substrate 308 are attached to each other, and thereby the adjacent microvoids in the defect layer 302 are coupled, and thus the volume of the microvoid is increased. As a result, as shown in FIG. 10A, the bond substrate 300 is split along the defect layer 302; thus, the semiconductor film 310 and the insulating film 301 which have been part of the bond substrate 300 are separated from the bond substrate 300. The heat treatment is preferably performed at a temperature that is equal to or lower than the allowable temperature limit of the bond substrate 300. For example, heat treatment may be performed at a temperature ranging from 400° C. to 600° C. After the separation, the semiconductor film 310 having an island shape and the insulating film 301 are transferred to the base substrate 308. After that, heat treatment at a temperature ranging from 400° C. to 600° C. is preferably performed in order to make stronger the attachment between the insulating film 301 and the insulating film 309.

Crystal plane orientation of the semiconductor film 310 can be controlled with the plane orientation of the bond substrate 300. The bond substrate 300 having crystal plane orientation which is suitable for a semiconductor element which is to be formed may be selected as appropriate. The mobility of the transistor depends on the crystal plane orientation of the semiconductor film 310. In order to obtain a transistor with higher mobility, the direction of bonding the bond substrate 300 is set in consideration of the direction of a channel and the crystal plane orientation.

Figure 10B:
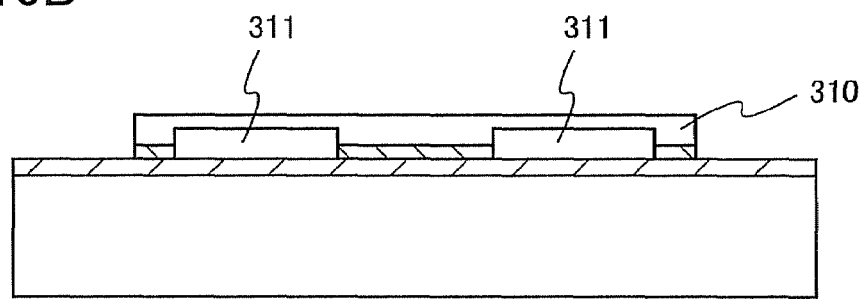

Next, as shown in FIG. 10B, a surface of the transferred semiconductor film 310 is planarized. Although the planarization is not necessarily essential, the planarization makes it possible to improve characteristics of the interface between the semiconductor film 310 and a gate insulating film in the transistor which is to be formed later. Specifically, the planarization can be performed by chemical mechanical polishing (CMP), liquid jet polishing, or the like. The thickness of the semiconductor film 310 is reduced by the above-described planarization.

Note that, although the case where a Smart Cut (registered trademark) method is used in which the semiconductor film 310 is separated from the bond substrate 300 using the defect layer is used is described in this embodiment mode, the semiconductor film 310 may be bonded to the base substrate 308 by another bonding method such as ELTRAN (epitaxial layer transfer), a dielectric isolation method, or a PACE (plasma assisted chemical etching) method.

A pair of cavities 311 formed from the recesses 304 is provided between the semiconductor film 310 having an island shape and the base substrate 308.

The present invention makes it possible to form various semiconductor elements such as transistors with the use of the semiconductor film 310 having an island shape, which is formed through the above-described steps.

In the manufacturing method of the present invention, the recesses 304 are formed by etching; thus, the cavities 311 with a desired depth and a desired shape can be formed precisely through a simple procedure.

Further, as in this embodiment mode, in the case of using a manufacturing method in which only the semiconductor film 310 having an island shape is separated from the bond substrate 300 and transferred to the base substrate 308, it is not necessary to pattern the semiconductor film which has been transferred onto the base substrate 308. Accordingly, heating due to a processing treatment of the base substrate 308 after the transfer and etching damage can be reduced.

Note that, the transistor formed using the semiconductor film 310 shown in FIG. 10B has the cavities 311 between the semiconductor film 310 and the base substrate 308, and the cavities 311 are in contact with the semiconductor film 310. Thus, when the cavities 311 are filled with air, nitrogen, an inert gas, or the like that has lower relative permittivity than an inorganic insulating film of silicon oxide or the like, parasitic capacitance or junction capacitance of the transistor can be reduced. It is desirable that the percentage of moisture contained in the above-described gas be decreased in order to suppress volume expansion with temperature change. Note that, in fact, a natural oxide film is formed, in some cases, in a portion of the semiconductor film 310, which is in contact with the cavities 311. However, the insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor can be reduced more in the present invention than in the case where the insulating film is formed to the above-described thickness in the portion of the semiconductor film 310, which is in contact with the cavities.

Note that, although the case where the cavities 311 are filled with gas such as air is described in this embodiment mode, the present invention is not limited to this structure. For example, the cavities 311 may be filled with a material other than gas that has lower relative permittivity than an inorganic insulating film of silicon oxide or the like, for example, a porous insulating film (a porous material) including a large number of pores therein.

In addition, although the structure in which two cavities 311 are provided between the semiconductor film 310 having an island shape and the base substrate 308 is described in this embodiment, the present invention is not limited to this structure. One cavity 311 may be provided, or three or more cavities 311 may be provided.

This embodiment can be implemented in combination with any of the embodiment modes as appropriate.

Embodiment Mode 5

In this embodiment mode, an example of a specific manufacturing method of a transistor in which semiconductor film formed in Embodiment Mode 3 or Embodiment Mode 4.

First as shown in FIG. 1A, an island-shaped semiconductor film 404 and an island-shaped semiconductor film 405 are formed over a base substrate 401 with a pair of cavities 402 and a pair of cavities 403 therebetween, respectively. An insulating film 406 formed over the base substrate 401 and an insulating film 407 formed so as to be in contact with the island-shaped semiconductor film 404 and the island-shaped semiconductor film 405 are attached together; thus, the island-shaped semiconductor film 404 and the island-shaped semiconductor film 405 are bonded to the base substrate 401.

An impurity may be added to the island-shaped semiconductor films 404 and 405 in order to control the threshold voltage. For example, in the case of adding boron as a p-type impurity, boron is preferably added at a concentration of greater than or equal to $5 \times 10^{17}$ cm$^3$ and less than or equal to $1 \times 10^{18}$ cm$^{-3}$. The addition of the impurity may be performed before the semiconductor film is transferred to the base substrate 401 or after the transfer.

Hydrogenation treatment may be performed after the island-shaped semiconductor films 404 and 405 are formed and before a gate insulating film 408 is formed. For example, the hydrogenation treatment is performed at 350° C. for about two hours in a hydrogen atmosphere.

Next, as shown in FIG. 1B, the gate insulating film 408 is formed so as to cover the island-shaped semiconductor films 404 and 405. The gate insulating film 408 is formed from a film having a single layer or a layered structure which contain silicon oxide, silicon oxynitride, silicon nitride, hafnium oxide, aluminum oxide, and/or tantalum oxide by plasma CVD, sputtering, or the like.

The gate insulating film 408 may be formed by oxidation or nitridation of surfaces of the island-shaped semiconductor films 404 and 405. High-density plasma treatment is performed using, for example, a mixed gas of a rare gas such as He, Ar, Kr, or Xe and oxygen, nitrogen oxide, ammonium, nitrogen, hydrogen, or the like. In this case, when plasma is excited by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby insulating films are formed to a thickness of 1 nm to 20 nm, desirably 5 nm to 10 nm so as to be in contact with the semiconductor films. The insulating films with a thickness of 5 nm to 10 nm are used as the gate insulating film 408.

Since the oxidation or nitridation of the semiconductor film by the above-described high-density plasma treatment progresses under a solid state reaction, interface state density between the gate insulating film and the island-shaped semiconductor films can be extremely low. In addition, the semiconductor films are directly oxidized or nitrided by the high-density plasma treatment, whereby variation in the thickness of the insulating film which is to be formed can be suppressed. Moreover, in the case where the semiconductor films have crystallinity, the surfaces of the semiconductor films are oxidized by solid state reaction using the high-density plasma treatment, whereby rapid oxidation only in crystal grain boundaries can be prevented and the gate insulating film with good uniformity and low interface state density can be formed. A transistor including the insulating film formed by the high-density plasma treatment in part of the gate insulating film or as the whole gate insulating film of the transistor can have little variation in the characteristics.

Figure 11A:
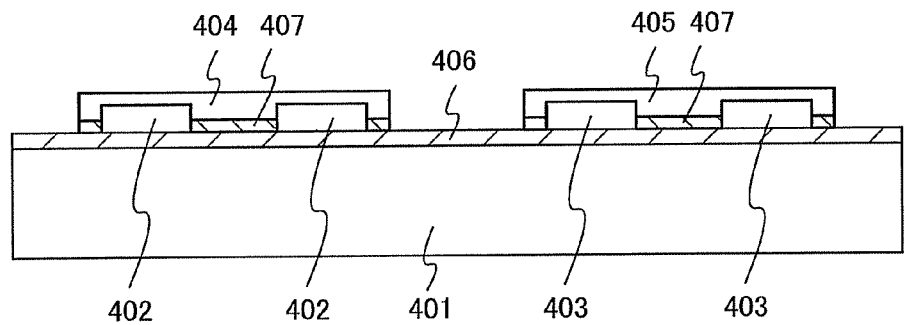
FIGS. 11A to 11D are views illustrating a manufacturing method of a semiconductor device of the present invention.
Figure 11B:
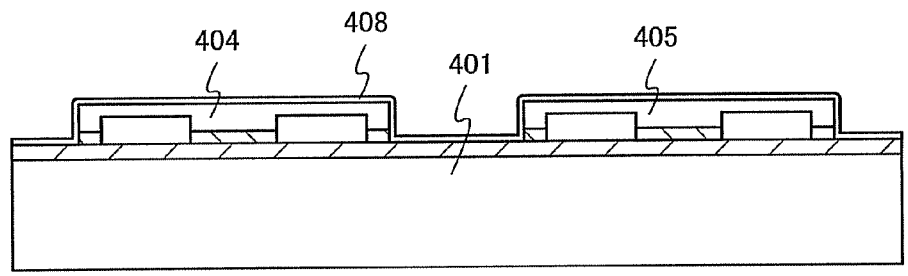
Figure 11C:
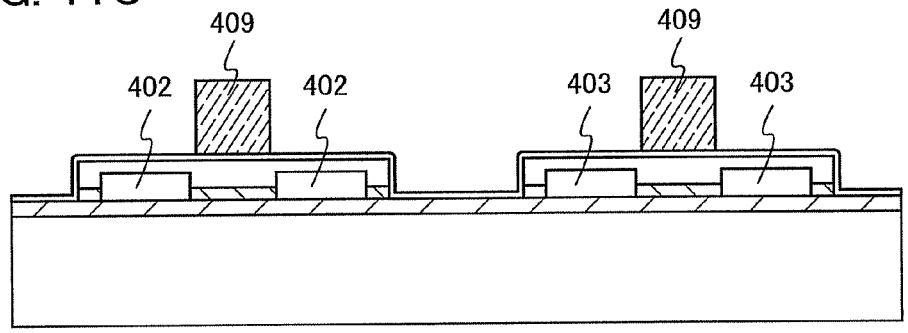

Next, as shown in FIG. 11C, conductive films are formed over the gate insulating film 408, and then the conductive films are processed (patterned) into predetermined shapes, whereby electrodes 409 are formed over the island-shaped semiconductor films 404 and 405. A CVD method, a sputtering method, or the like can be used for forming the conductive films. Tantalum (Ta), tungsten (W), titanium (Ti), molybdenum (Mo), aluminum (Al), copper (Cu), chromium (Cr), niobium (Nb), or the like can be used for forming the conductive films. Alternatively, an alloy containing the above-described metal as its main component or a compound containing as the above-described metal may be used. Further alternatively, the conductive films may be formed using a semiconductor such as polycrystalline silicon which is formed by addition of an impurity element imparting a conductivity type, such as phosphorus, to a semiconductor film.

As a combination of two conductive films, tantalum nitride or tantalum (Ta) can be used for a first layer, and tungsten (W) can be used for a second layer. Besides the above-described example, tungsten nitride and tungsten; molybdenum nitride and molybdenum; aluminum and tantalum; aluminum and titanium; and the like can be given. Since tungsten and tantalum nitride have high thermal resistance, thermal treatment for thermal activation can be performed after the first conductive film and the second conductive film are formed. As a combination of the second conductive film, for example, silicon doped with an impurity imparting n-type conductivity and NiSi (nickel silicide); silicon doped with an impurity imparting n-type conductivity and $WSi_x$; or the like can be used.

In addition, although each of the electrodes 409 is formed of a single-layer conductive film in this embodiment, this embodiment mode is not limited to this structure. Each of the electrodes 409 may be formed of a plurality of conductive films which is stacked. In the case of a three-layer structure in which three or more conductive films are stacked, a stacked structure including a molybdenum film, an aluminum film, and a molybdenum film may be used.

As masks used when the electrodes 409 are formed, instead of resist, silicon oxide, silicon oxynitride, or the like may be used. Although, in this case, a step of forming the mask made of silicon oxide or silicon nitride by patterning is added, since the reduction in film thickness and width of the mask at the time of etching is less than that in the case of using a resist mask, the electrodes 409 with desired widths can be formed. Alternatively, the electrodes 409 may be formed selectively by a droplet discharge method without using the mask.

Note that a droplet discharge method refers to a method in which droplets containing a predetermined composition are discharged from a pore to form a predetermined pattern, and an inkjet method or the like is included in the category.

The electrodes 409 can be etched into desired tapered shapes by ICP (inductively coupled plasma) etching and appropriate control of the etching conditions (e.g., the amount of electric power applied to a coiled electrode layer, the amount of electric power applied to an electrode layer on the substrate side, and the electrode temperature on the substrate side). The angle of the tapered shape depends on the shape of the mask. Note that as an etching gas, a chlorine-based gas such as $Cl_2$, $BCl_3$, $SiCl_4$, or $CCl_4$, a fluorine-based gas such as $CF_4$, $SF_6$, or $NF_3$, or oxygen can be used as appropriate.

In the case of using a high dielectric constant substance (a high-k material) for the gate insulating film 408, the electrode 409 is formed of polycrystalline silicon, silicide, a metal, or metal nitride. In particular, it is most desirable that the electrode 409 be formed of a metal or metal nitride in the case of using a high dielectric constant substance. For example, the conductive film which is in contact with the gate insulating film 408 is formed of a metal nitride material and the conductive film thereover is formed of a metal material. This combination makes it possible to prevent a depletion layer from being extended in the electrode 409 even when the gate insulating film 408 is thinned and to prevent drive capability of a transistor from being deteriorated even when the transistor is miniaturized.

Figure 11D:
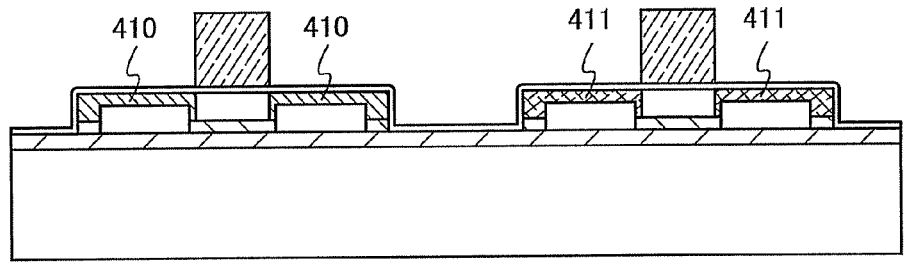

Next, as shown in FIG. 11D, an impurity element imparting one conductivity type is added to the semiconductor films 404 and 405 with the use of the electrodes 409 as masks. In this embodiment mode, an impurity element imparting p-type conductivity (e.g., boron) is added to the semiconductor film 405, and an impurity element imparting n-type conductivity (e.g., phosphorus or arsenic) is added to the semiconductor film 404. Note that when the impurity element imparting p-type conductivity is added to the semiconductor film 405, the semiconductor film 404 to which the n-type impurity is added is covered with a mask or the like so that the addition of the impurity element imparting p-type conductivity can be performed selectively. On the other hand, when the impurity element imparting n-type conductivity is added to the semiconductor film 404, the semiconductor film 405 to which the p-type impurity is added is covered with a mask or the like so that the addition of the impurity element imparting n-type conductivity can be performed selectively. Alternatively, after the impurity element imparting p-type or n-type conductivity is added to the semiconductor film 404 and the semiconductor film 405, either one of the impurity element imparting p-type conductivity or the impurity element imparting n-type conductivity may be selectively added to only one of the semiconductor film 404 or the semiconductor film 405 at higher concentration. By the above-described addition of the impurity, impurity regions 410 and 411 are formed in the semiconductor films 404 and 405, respectively.

Figure 12A:
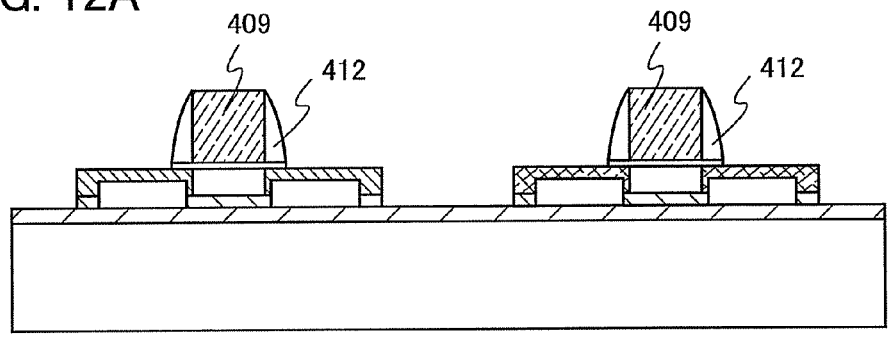
FIGS. 12A to 12C are views illustrating a manufacturing method of a semiconductor device of the present invention.

Next, as shown in FIG. 12A, a sidewall 412 is formed on side surfaces of each of the electrode 409. For example, the sidewall 412 can be formed in such a manner that another insulating film is formed so as to cover the gate insulating film 408 and the electrode 409, and the insulating film is partially etched by anisotropic etching in which etching is performed mainly in a perpendicular direction. The newly-formed insulating film is partially etched by the above-described anisotropic etching, whereby the sidewall 412 is formed on the side surfaces of each of the electrodes 409. The insulating film for forming the sidewall 412 may be formed of a single layer such as a silicon film, a silicon oxide film, a silicon oxynitride film, or a silicon nitride oxide film, or a film containing an organic material such as an organic resin which are formed by plasma CVD, sputtering, or the like, or a laminate thereof. In this embodiment mode, a silicon oxide film is formed to a thickness of 100 nm by plasma CVD. In addition, as an etching gas, a mixed gas of $CHF_3$ and He can be used. Note that the steps of forming the sidewall 412 are not limited to these steps.

Figure 12B:
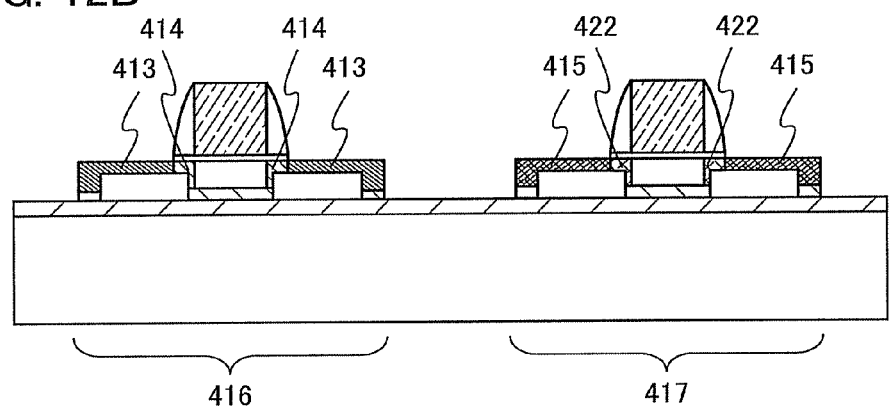

Next, as shown in FIG. 12B, an impurity element imparting one conductivity type is added to the semiconductor films 404 and 405 with the use of the sidewalls 412 as masks. Note that the impurity elements imparting the same conductivity type as the impurity elements which have been added to the semiconductor films 404 and 405 in the previous step are added to the semiconductor films 404 and 405 at higher concentration than in the previous step. Note that when the impurity element imparting p-type conductivity is added to the semiconductor film 405, the semiconductor film 404 to which the n-type impurity is added is covered with a mask or the like so that the addition of the impurity element imparting p-type conductivity can be performed selectively. On the other hand, when the impurity element imparting n-type conductivity is added to the semiconductor film 404, the semiconductor film 405 to which the p-type impurity element is added is covered with a mask or the like so that the addition of the impurity element imparting n-type conductivity can be performed selectively.

By the above-descried addition of the impurity element, a pair of high concentration impurity regions 413 and a pair of low concentration impurity regions 414 are formed in the semiconductor film 404. One of the high concentration impurity regions 413 functions as a source and the other functions as a drain, and the low concentration impurity regions 414 function as LDD (lightly doped drain) regions. In addition, by the above-described addition of the impurity element, a pair of high concentration impurity regions 415 and a pair of low concentration impurity regions 422 are formed in the semiconductor film 405.

Note that the sidewall 412 formed over the semiconductor film 405 and the sidewall 412 formed over the semiconductor film 404 may be formed so as to have the same width in the channel flow direction, or may be formed so as to have different widths. It is preferable that the width of the sidewall 412 over the semiconductor film 405 which constitutes a part of a p-type transistor be larger than the width of the sidewall 412 over the semiconductor film 404 which constitutes a part of an n-type transistor. This is because boron which is added for forming a source and a drain in the p-type transistor is easily diffused and a short channel effect is easily induced. When the width of the sidewall 412 in the p-type transistor is made larger than that of the sidewall 412 in the n-channel transistor, boron can be added to the source and the drain at high concentration, and thus the resistance of the source and the drain can be reduced.

Next, a silicide layer may be formed by silicification of the semiconductor films 404 and 405 in order to further reduce the resistance of the source and the drain. The silicification is performed in such a manner that the a metal is brought into contact with the semiconductor film, and silicon in the semiconductor film is made to react with the metal by heat treatment, a GRTA method, an LRTA method, or the like. Cobalt silicide or nickel silicide may be used for the silicide layer. In the case where the semiconductor films 404 and 405 are thin, silicide reaction may be proceeded to bottoms of the semiconductor films 404 and 405 in this region so that the semiconductor films 404 and 405 are fully silicified. As a metal material used for the silicification, the following can be used: titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), or the like. Alternatively, silicide may be formed by laser irradiation or light irradiation using a lamp or the like.

Through the above-described series of steps, an n-channel transistor 416 and a p-channel transistor 417 are manufactured.

Figure 12C:
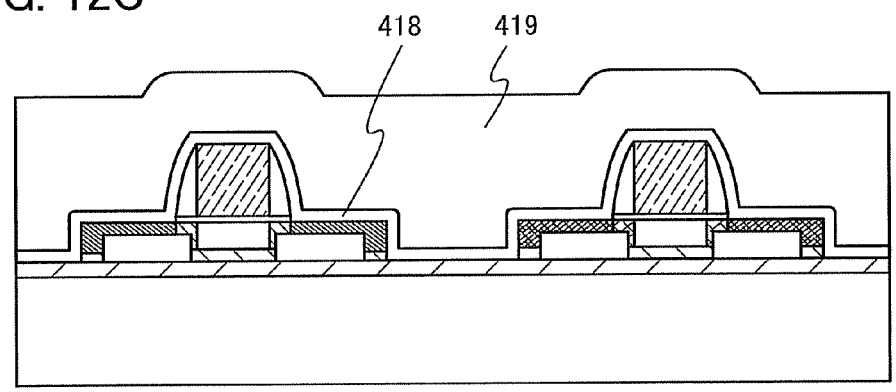

Next, as shown in FIG. 12C, an insulating film 418 is formed in order to protect the transistors 416 and 417. Although the insulating film 418 is not necessarily provided, the provision of the insulating film 418 makes it possible to prevent impurities such as an alkali metal or an alkaline earth metal from entering the transistors 416 and 417. Specifically, it is desirable to use silicon nitride, silicon nitride oxide, aluminum nitride, aluminum oxide, silicon oxide, or the like for the insulating film 418. In this embodiment mode, a silicon oxynitride film formed to a thickness of about 600 nm is used as the insulating film 418. In this case, the above-described hydrogenation step may be performed after the formation of the silicon oxynitride film.

Next, an insulating film 419 is formed over the insulating film 418 so as to cover the transistors 416 and 417. An organic material having heat resistance, such as polyimide, acrylic, polyimideamide, benzocyclobutene, polyamide, or epoxy can be used for the insulating film 419. Besides the above-described organic material, the following can be used: a low dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like. The siloxane-based resin may include, besides hydrogen, at least one of fluorine, an alkyl group, or aromatic hydrocarbon as a substituent. Note that the insulating film 419 may be formed of a layer in which a plurality of insulating films each formed of the above-described material is stacked. A surface of the insulating film 419 may be planarized by a CMP method, liquid jet polishing, or the like.

Note that the siloxane-based resin corresponds to a resin including a Si—O—Si bond formed using a siloxane-based material as a starting material. The siloxane-based resin may include, besides hydrogen, at least one of fluorine, an alkyl group, or aromatic hydrocarbon as a substituent.

For the formation of the insulating film 419, the following method can be used depending on the material of the insulating film 419: a CVD method, a sputtering method, an SOG method, a spin coating method, a dip coating method, a spray coating method, a droplet discharge method (e.g., an inkjet method, screen printing, or an offset printing), a doctor knife, a roll coater, a curtain coater, a knife coater, or the like.

Figure 13:
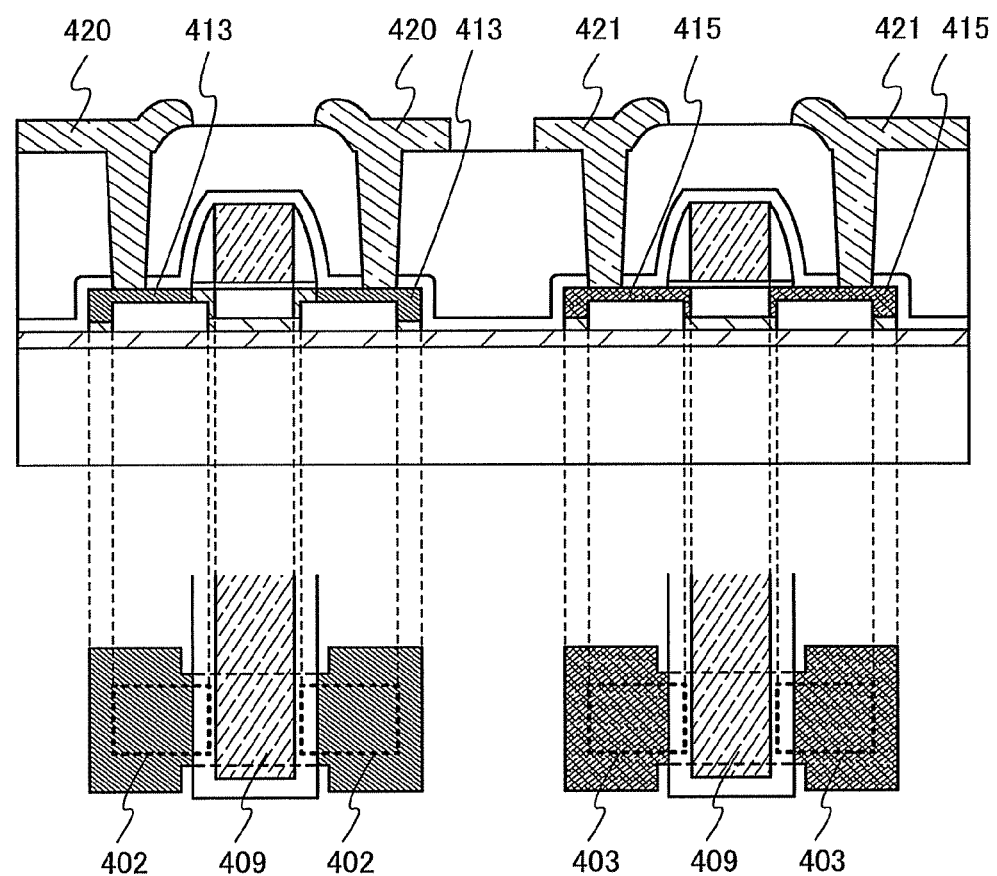
FIG. 13 is a view illustrating a manufacturing method of a semiconductor device of the present invention.

Next, as shown in FIG. 13, contact holes are formed in the insulating films 418 and 419 so that the island-shaped semiconductor films 404 and 405 are partially exposed. Then, conductive films 420 and 421 are formed to be in contact with the island-shaped semiconductor films 404 and 405, respectively through the contact holes. Although a mixed gas of $CHF_3$ and He is used as a gas used at the time of forming the contact holes, the gas is not limited to the mixed gas.

The conductive films 420 and 421 can be formed by CVD, sputtering, or the like. Specifically, the following can be used for the conductive films 420 and 421: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as its main component or a compound containing the above-described metal may be used. The conductive films 420 and 421 can be formed of a single layer of a film formed using the above-described metal or a layer in which a plurality of films each formed using the above-described metal is stacked.

As an example of an alloy containing aluminum as its main component, an alloy containing aluminum as its main component and also containing nickel is given. In addition, an alloy containing aluminum as its main component and also containing nickel and one or both of nickel and silicon can also be given as the example thereof. Since aluminum and aluminum silicon have low resistance values and are inexpensive, aluminum and aluminum silicon are suitable for a material for forming the conductive films 420 and 421. In particular, generation of hillocks in resist baking can be prevented more in the case where an aluminum silicon (Al—Si) film is used for forming the conductive films 420 and 421 by patterning than in the case where an aluminum film is used. Alternatively, Cu, instead of silicon (Si), may be mixed into the aluminum film at about 0.5 wt %.

For example, a stacked structure including a barrier film, an aluminum silicon film, and a barrier film or a stacked structure including a barrier film, an aluminum silicon film, a titanium nitride film, and a barrier film may be used for the conductive films 420 and 421. Note that the barrier film refers to a film formed using titanium, a nitride of titanium, molybdenum, or a nitride of molybdenum. When the barrier films are formed so that the aluminum silicon film is interposed therebetween, generation of hillocks of aluminum or aluminum silicon can be further prevented. Moreover, when the barrier film is formed using titanium that is a highly-reducible element, even if a thin oxide film is formed over the island-shaped semiconductor films 404 and 405, the natural oxide film is reduced by the titanium contained in the barrier film, whereby preferable contact between the conductive films 420 and 421 and the island-shaped semiconductor films 404 and 405 can be obtained. Alternatively, a layer in which a plurality of barrier films is stacked may be used. In that case, for example, a five-layer structure in which titanium, titanium nitride, aluminum silicon, titanium, and titanium nitride are stacked from the lowest layer can be used for the conductive films 420 and 421.

Note that the conductive film 420 is connected to the high concentration impurity region 413 of the n-channel transistor 416. The conductive film 421 is connected to the high concentration impurity region 415 of the p-channel transistor 417.

FIG. 13 is a top view of the n-channel transistor 416 and the p-channel transistor 417. In this embodiment mode, electrodes 409 are provided so as to overlap with the pair of cavities 402 and the pair of cavities 403; however, the present invention is not limited this structure. The number of cavities 402 and 403, the layout of the cavities 402 and 403, and the positional relationship between the cavities 402, the cavities 403, and the electrodes 409 are not limited to the structure described in this embodiment mode.

In addition, although the case where each of the n-channel transistor 416 and the p-channel transistor 417 includes one gate electrode functioning as the gate is shown as an example in this embodiment mode, the present invention is not limited to this structure. The transistor included in the semiconductor device of the present invention may include a plurality of electrodes functioning as gates, and also may have a multi-gate structure in which the plurality of electrodes are electrically connected to one another.

Moreover, the transistor included in the semiconductor device of the present invention may have a gate planar structure.

Since the island-shaped semiconductor film is formed over the base substrate in the semiconductor device using the manufacturing method of the present invention, element separation is not needed; thus, the process can be simplified. In addition, in the manufacturing method of the present invention, the cavities 402 and 403 are formed by etching; thus, the cavities 402 and 403 with desired depths and shapes can be formed precisely through a simple procedure.

This embodiment can be implemented in combination with any of the embodiment modes as appropriate.

Embodiment 1

In this embodiment, the configuration of circuits each using a transistor having an SON structure of the present invention will be described in detail by taking an inverter as an example. A circuit diagram of the inverter is shown in FIG. 14A, and a top view of the inverter shown in FIG. 14A is shown in FIG. 14B, as an example.

Figure 14A:
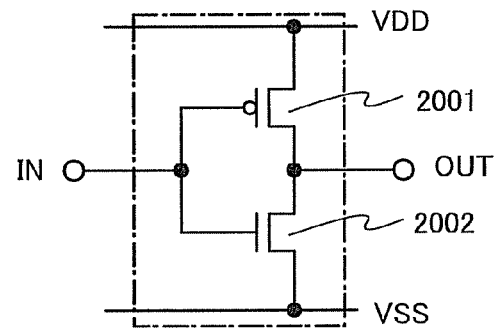
FIGS. 14A to 14C are views illustrating a structure of an inverter included in a semiconductor device of the present invention.

The inverter shown in FIG. 14A has p-channel transistors 2001 and n-channel transistors 2002. The transistors 2001 and the transistors 2002 are connected in series. Specifically, drains of the transistors 2001 and drains of the transistors 2002 are connected. The electric potential of the drains of the transistors 2001 and the drains of the transistors 2002 is applied to an output terminal OUT.

Further, gates of the transistors 2001 and gates of the transistors 2002 are connected. The potential of a signal inputted to an input terminal IN is applied to the gates of the transistors 2001 and the gates of the transistors 2002. A high level voltage VDD is applied to sources of the transistors 2001 while a low level voltage VSS is applied to sources of the transistors 2002.

Figure 14B:
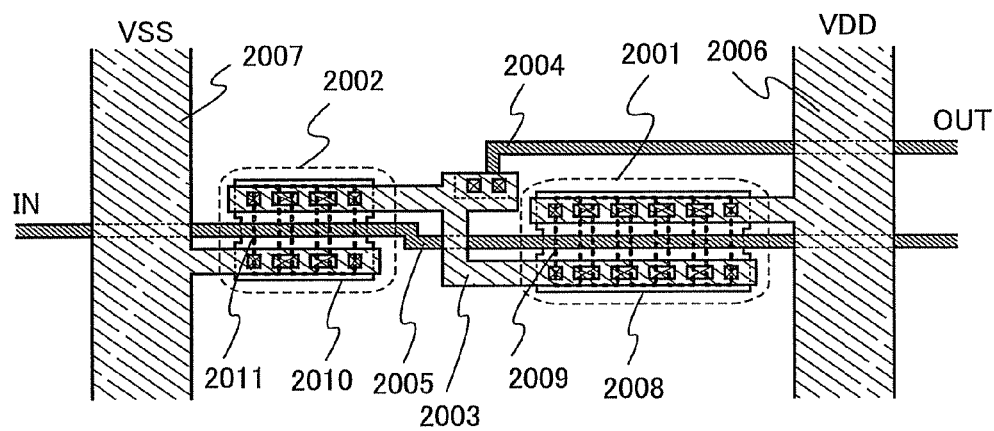

In the inverter shown in FIG. 14B, the drains of the transistors 2001 and the drains of the transistors 2002 are electrically connected through a wiring 2003. The wiring 2003 is connected to a wiring 2004. Therefore, the potential of the drains of the transistors 2001 and the drains of the transistors 2002 is applied as the potential of the output terminal OUT to a circuit in the next stage through the wiring 2003 and the wiring 2004.

Further, in the inverter shown in FIG. 14B, parts of a wiring 2005 function as the gates of the transistors 2001 and the gates of the transistors 2002. The potential applied to the wiring 2005 is applied to the gates of the transistors 2001 and the gates of the transistors 2002 as the potential of the input terminal IN. The high level voltage VDD is applied to the sources of the transistors 2001 through a wiring 2006, and the high level voltage VSS is applied to the sources of the transistors 2002 through a wiring 2007.

A semiconductor film 2008 included in the transistors 2001 has cavities 2009 between the semiconductor film 2008 and a substrate. Further, a semiconductor film 2010 included in the transistors 2002 has cavities 2011 between the semiconductor film 2010 and the substrate. For the purpose of defining the positional relationships between the semiconductor film 2008 and the cavities 2009 and between the semiconductor film 2010 and the cavities 2011, only the semiconductor film 2008, the cavities 2009, the semiconductor film 2010, and the cavities 2011 in the inverter shown in FIG. 14B are shown in FIG. 14C.

Figure 14C:
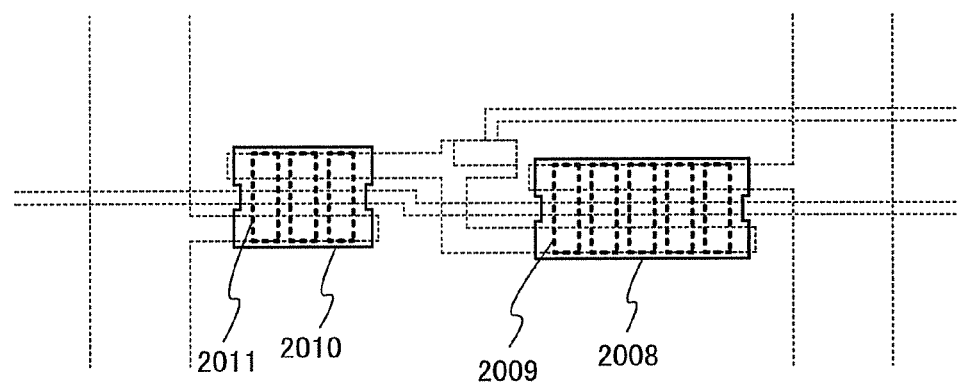

As shown in FIG. 14C, a plurality of the cavities 2009 is formed between the semiconductor film 2008 and the substrate. The plurality of the cavities 2009 is formed in regions which overlap with the sources, channel formation regions, and the drains of the transistors 2001. Similarly, a plurality of the cavities 2011 is formed between the semiconductor film 2010 and the substrate. The plurality of the cavities 2011 is formed in regions which overlap with the sources, channel formation regions, and the drains of the transistors 2002.

Note that the plurality of cavities 2009 and the plurality of the cavities 2011 are provided in the semiconductor film 2008 and the semiconductor film 2010, respectively in FIG. 14B and FIG. 14C; however, the present invention is not limited to this structure. Alternatively, a single cavity space may be formed under the semiconductor film. If the area where a single cavity space is formed is the same as the area where a plurality of cavities is formed, transistors having higher physical strength can be formed in the case of forming the plurality of cavities than in the case of forming the plurality of cavities. Meanwhile, in the case of forming a single cavity space, since a cavity space can be formed so as to have a larger area under the semiconductor film, junction capacitance can be reduced more than in the case of forming a plurality of cavities.

Further, the cavities 2009 and the cavities 2011 are formed in the regions which overlap with the sources, the channel formation regions, the drains of the transistors 2001 and the transistors 2002, respectively in FIG. 14B and FIG. 14C; however, the present invention is not limited to this structure. Alternatively, the cavities may be formed so as to overlap with either the sources or the drains. In this case, the cavities may overlap with the channel formation regions, which is optional. When the cavities overlap with at least the sources or drains, junction capacitance can be reduced more than the case of forming cavities which overlap with only the channel formation regions. In contrast, when the cavities which overlap with at least the channel formation regions are formed, self-heating can be reduced more than the case of forming cavities which overlap with only the sources or drains.

This embodiment can be implemented in combination with any of the above embodiment modes as appropriate.

Embodiment 2

In this embodiment, the configuration of circuits each using a transistor having an SON structure of the present invention will be described in detail by taking a NAND as an example. A circuit diagram of the NAND is shown in FIG. 15A, and a top view of the NAND shown in FIG. 15A is shown in FIG. 15B, as an example.

Figure 15A:
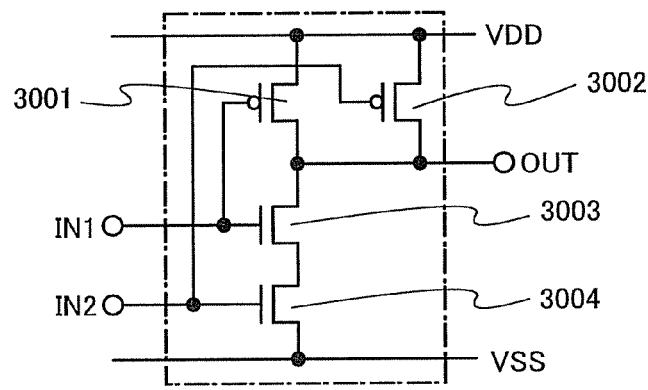
FIGS. 15A to 15C are views illustrating a structure of a NAND included in a semiconductor device of the present invention.

The NAND shown in FIG. 15A has p-channel transistors 3001, p-channel transistors 3002, n-channel transistors 3003, and n-channel transistors 3004. The transistors 3001, the transistors 3003, and the transistors 3004 are connected in series in that order. Meanwhile, the transistors 3001 and the transistors 3002 are connected in parallel.

Specifically, a high level voltage VDD is applied to either of sources or drains of the transistors 3001 and the others are connected to an output terminal OUT. A high level voltage VDD is applied to either of sources or drains of the transistors 3002 and the others are connected to the output terminal OUT. A low level voltage VSS is applied to either of sources or drains of the transistors 3004. Either of sources or drains of the transistors 3003 are connected to the output terminal OUT. Further, the others of the sources and drains of the transistors 3003 are connected to the others of the sources and drains of the transistors 3004. The potential of an input terminal IN1 is applied to gates of the transistors 3001 and gates of the transistors 3003. Further, the potential of an input terminal IN2 is applied to gates of the transistors 3002 and gates of the transistors 3004.

Figure 15B:
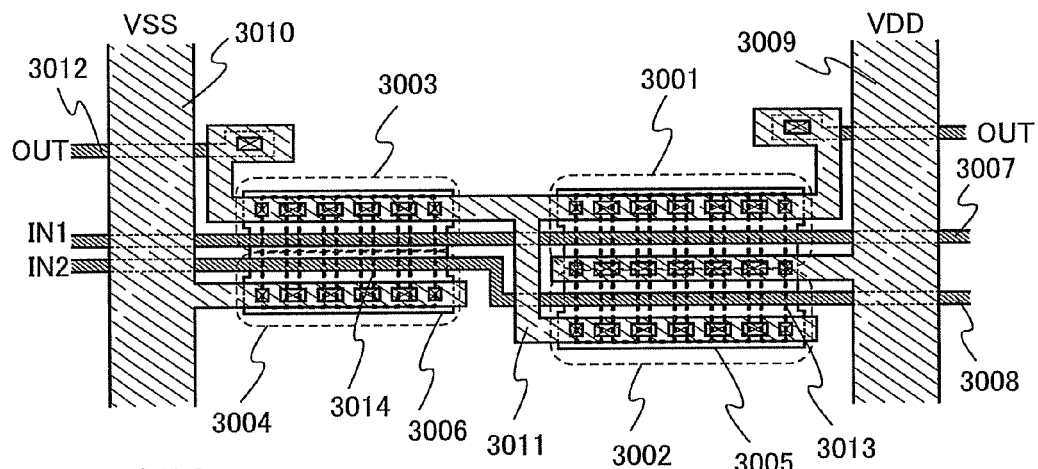

In the NAND shown in FIG. 15B, the transistors 3001 and the transistors 3002 which are connected in series share a semiconductor film 3005. Meanwhile, the transistors 3003 and the transistors 3004 which are connected in series share a semiconductor film 3006. Further, parts of a wiring 3007 function as the gates of the transistors 3001 and the gates of the transistors 3003. The potential applied to the wiring 3007 is applied to the gates of the transistors 3001 and the gates of the transistors 3003 as the potential of the input terminal IN1. Parts of a wiring 3008 function as the gates of the transistors 3002 and the gates of the transistors 3004. The potential applied to the wiring 3008 is applied to the gates of the transistors 3002 and the gates of the transistors 3004 as the potential of the input terminal IN2.

The high level voltage VDD is applied to either the sources or the drains of the transistors 3001 and either the sources or the drains of the transistors 3002 through a wiring 3009. Further, the low level voltage VSS is applied to either the sources or the drains of the transistors 3004 through a wiring 3010. The potential of the others of the sources and the drains of the transistors 3001, the others of the sources and the drains of the transistors 3002, and either the sources or the drains of the transistors 3003 is applied as the potential of the output terminal OUT to a circuit in the next stage through a wiring 3011 and a wiring 3012.

A semiconductor film 3005 has cavities 3013 between the semiconductor film 3005 and a substrate. Further, a semiconductor film 3006 has cavities 3014 between the semiconductor film 3006 and the substrate. For the purpose of defining the positional relationships between the semiconductor film 3005 and the cavities 3013 and between the semiconductor film 3006 and the cavities 3014, only the semiconductor film 3005, the cavities 3013, the semiconductor film 3006, and the cavities 3014 in the NAND shown in FIG. 15B are shown in FIG. 15C.

Figure 15C:
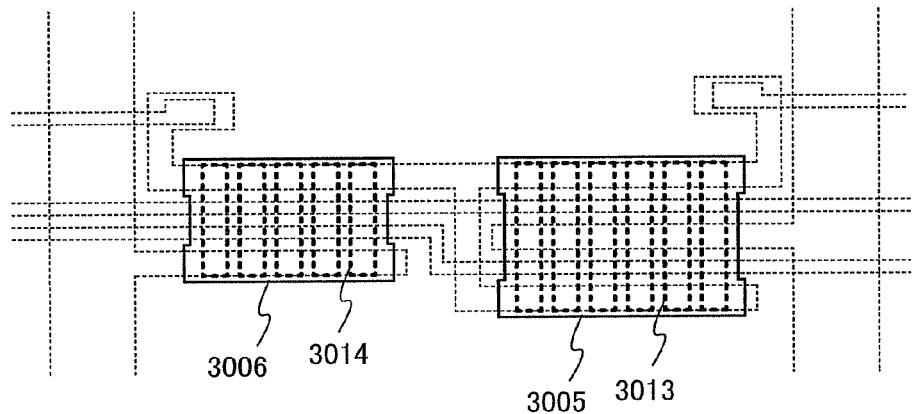

As shown in FIG. 15C, a plurality of the cavities 3013 is formed between the semiconductor film 3005 and the substrate. The plurality of cavities 3013 is formed in regions which overlap with the sources, channel formation regions, and the drains of the transistors 3001 and the sources, channel formation regions, and the drains of the transistors 3002. Similarly, a plurality of the cavities 3014 is formed between the semiconductor film 3006 and the substrate. The plurality of the cavities 3014 is formed in regions which overlap with the sources, channel formation regions, and the drains of the transistors 3003 and the sources, channel formation regions, and the drains of the transistors 3004.

Note that the plurality of cavities 3013 and the plurality of the cavities 3014 are provided in the semiconductor film 3005 and the semiconductor film 3006, respectively in FIG. 15B and FIG. 15C; however, the present invention is not limited to this structure. Alternatively, a single cavity space may be formed under the semiconductor film. If the area where a single cavity space is formed is the same as the area where a plurality of cavities is formed, transistors having higher physical strength can be formed in the case of forming the plurality of cavities than the case of forming the plurality of cavities. Meanwhile, in the case of forming a single cavity space, since a cavity space can be formed so as to have a larger area under the semiconductor film, junction capacitance can be reduced more than the case of forming a plurality of cavities.

Further, the cavities 3013 and are formed in the regions which overlap with the sources, the channel formation regions, and the drains of each of the transistors 3001 the transistors 3002, while the cavities 3014 are formed in the regions which overlap with the sources, the channel formation regions, and the drains of each of the transistors 3003, and the transistors 3004 in FIG. 15B and FIG. 15C; however, the present invention is not limited to this structure. Alternatively, the cavities may be formed so as to overlap with either the sources or the drains. In this case, the cavities may overlap with the channel formation regions, which is optional. When the cavities overlap with at least the sources or drains, junction capacitance can be reduced more than the case of forming cavities which overlap with only the channel formation regions. Conversely, when the cavities which overlap with at least the channel formation regions are formed, self-heating can be reduced more than the case of forming cavities which overlap with only the sources or drains.

In FIG. 15B and FIG. 15C, the transistors 3001 and the transistors 3002 share the semiconductor film 3005 and the cavities 3013; however, the present invention is not limited to the structure. When a plurality of transistors share a semiconductor film and cavities, while the area on the substrate, which is occupied by the plurality of transistors can be kept small, a transistor having lower junction capacitance can be formed.

This embodiment can be implemented in combination with any of the above embodiment modes and embodiment as appropriate.

Embodiment 3

Figure 16:
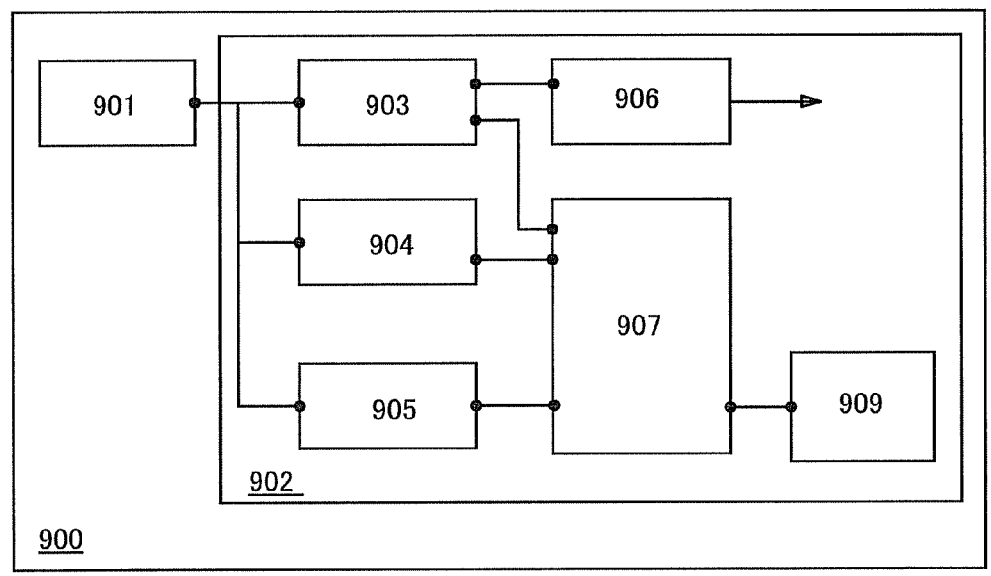
FIG. 16 is a diagram showing a structure of an RF tag which is one of semiconductor devices of the present invention.

In this embodiment, a structure of an RF tag which is one of semiconductor devices of the present invention will be described with reference to FIG. 16. FIG. 16 is a block diagram illustrating one mode of an RF tag of the present invention. In FIG. 16, an RF tag 900 has an antenna 901 and an integrated circuit 902. The integrated circuit 902 has a power supply circuit 903, a demodulation circuit 904, a modulation circuit 905, a regulator 906, a control circuit 907, and a memory 909. The rectifier circuit of the present invention can be used in the power supply circuit 903 and the demodulation circuit 904.

When radio waves are transmitted from an interrogator, the radio waves are converted into an AC voltage in the antenna 901. In the power supply circuit 903, the AC voltage from the antenna 901 is rectified to generate a voltage for a power supply. The voltage for a power supply, which is generated in the power supply circuit 903, is fed to the control circuit 907 and the regulator 906. After stabilizing the voltage for a power supply from the power supply circuit 903 or after adjusting the level thereof, the regulator 906 supplies the voltage to circuits such as the demodulation circuit 904, the modulation circuit 905, the control circuit 907, or the memory 909 in the integrated circuit 902.

The demodulation circuit 904 demodulates the AC signal received by the antenna 901 to output the signal to the control circuit 907 of a next stage. The control circuit 907 performs arithmetic processing in accordance with the signal inputted from the demodulation circuit 904 and generates a new signal. When the arithmetic processing is performed, the memory 909 can be used as a primary cache memory or a secondary cache memory. Further, the control circuit 907 analyses the signal inputted from the demodulation circuit 904, and data in the memory 909 is outputted or the content of an instruction in the memory 909 is stored in accordance with the content of an instruction transmitted from the interrogator. The signal outputted from the control circuit 907 is encoded and transmitted to the modulation circuit 905. The modulation circuit 905 modulates the radio waves received by the antenna 901 in accordance with the signal. The radio waves modulated in the antenna 901 is received by the interrogator. Then, data outputted from the RF tag 900 can be obtained.

Thus, communication between the RF tag 900 and the interrogator can be performed by modulating a radio waves used as a carrier (carrier wave). As the carrier, there are radio waves with frequencies of 125 kHz, 13.56 MHz, 950 MHz, and the like, which vary depending on the standard. A modulation method includes various methods such as amplitude modulation, frequency modulation, and phase modulation, depending on the standard; however, any modulation method may be employed as long as it is based on the standard.

A signal transmission method can be categorized into a variety of methods such as an electromagnetic coupling method, an electromagnetic induction method, a microwave method, and the like depending on the wavelength of a carrier.

The memory 909 may be either a nonvolatile memory or a volatile memory. As the memory 909, for example, an SRAM, a DRAM, a flash memory, an EEPROM, an FeRAM, or the like can be used.

In this embodiment, a structure of the RF tag 900 having the antenna 901 is described; however, the RF tag of the present invention does not necessarily include an antenna. In addition, the RF tag illustrated in FIG. 16 may be provided with an oscillation circuit or a secondary battery.

In FIG. 16, a structure of the RF tag including only one antenna is described; however, the present invention is not limited to this structure. The RF tag may have two antennas, that is, an antenna for receiving power and an antenna for receiving a signal. If the RF tag has one antenna, in the case where both supply of power and transmission of a signal are performed with radio waves of 950 MHz for example, a large amount of power might be transmitted to a distance to impede reception of other wireless devices. Therefore, it is desirable that power be supplied over a short distance using radio waves with reduced frequency; however, a communication distance is inevitably short in this case. On the other hand, if the RF tag includes two antennas, frequency of radio waves for supplying power and frequency of radio waves for transmitting a signal can be separately used. For example, in the case of transmitting power, electromagnetic induction using radio waves at a frequency of 13.56 MHz can be used, and in the case of transmitting a signal, a radio frequency method using radio waves at a frequency of 950 MHz can be used. By thus separately using antennas depending on functions, power can be supplied for communication only over a short distance and a signal can be transmitted even over a long distance.

In the RF tag which is one of semiconductor devices of the present invention, the integrated circuit 902 is formed using a substrate having an insulating surface or insulating substrate or a single-crystal semiconductor layer (SOI layer) which is attached onto an insulating substrate; therefore, not only faster processing speed but also lower power consumption can be achieved. Further, using a transistor in which junction capacitance is suppressed, the RF tag can be driven at high speed. Furthermore, since the RF tag has cavities which are in contact with a semiconductor film, heat generated in driving the transistor can be released efficiently. Thus, malfunction, destruction of an element, or the like due to self-heating can be prevented.

This embodiment can be implemented in combination with any of the above embodiment modes and embodiments as appropriate.

Embodiment 4

In this embodiment, a structure of a CPU (central processing unit) which is one of semiconductor devices of the present invention will be described.

Figure 17:
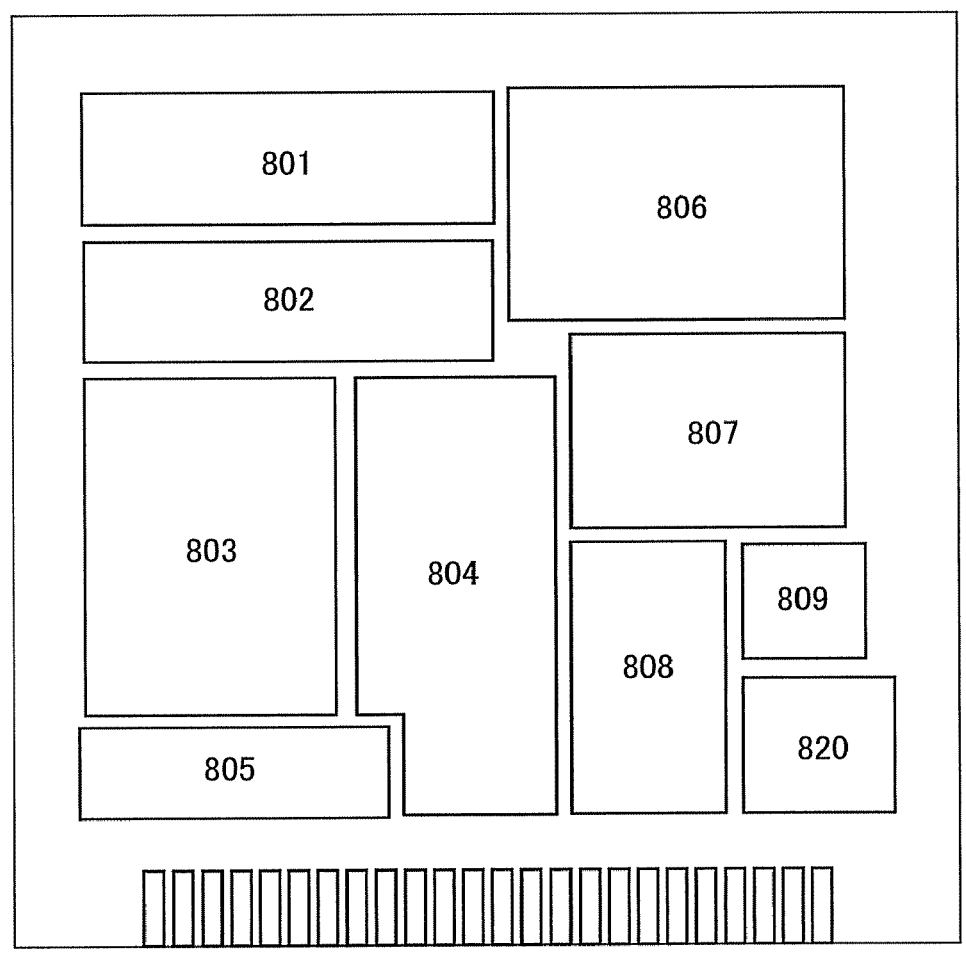
FIG. 17 is a diagram showing a structure of a CPU which is one of semiconductor devices of the present invention.

FIG. 17 is a block diagram illustrating a structure of the CPU of this embodiment. A CPU shown in FIG. 17 mainly includes an arithmetic logic unit (ALU) 801, an ALU controller 802, an instruction decoder 803, an interrupt controller 804, a timing controller 805, a register 806, a register controller 807, a bus interface (Bus I/F) 808, a memory 809 and a memory interface 820, over a substrate 800. The memory 809 and the memory interface 820 may be provided over another chip. Naturally, the CPU shown in FIG. 17 is only an example in which the configuration is simplified, and an actual CPU may have various configurations depending on the uses.

An instruction inputted to the CPU through the bus interface 808 is decoded in the instruction decoder 803, and then inputted to the ALU controller 802, the interrupt controller 804, the register controller 807 and the timing controller 805. The ALU controller 802, the interrupt controller 804, the register controller 807 and the timing controller 805 conduct various controls based on the decoded instruction. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-mentioned circuits.

In the CPU which is one of semiconductor devices of the present invention, an integrated circuit is formed using a substrate having an insulating surface or a single-crystal semiconductor layer (SOI layer) which is attached onto an insulating substrate; therefore, not only faster processing speed but also lower power consumption can be achieved. Further, using a transistor in which junction capacitance is suppressed, the CPU can be driven at high speed. Furthermore, since the CPU has cavities which are in contact with a semiconductor film, heat generated in driving the transistor can be released efficiently. Thus, malfunction, destruction of an element, or the like due to self-heating can be prevented.

Further, since a semiconductor substrate is less prone to shrinking due to heat treatment and a semiconductor substrate has a less undulated surface, than a glass substrate. Accordingly, when a semiconductor substrate is used as a base substrate, alignment accuracy and elaboration of a mask can be increased; thus, an ultrafine pattern of 100 nm or less can be formed. Thus, high performance, low power consumption, and high integration can be realized, which makes it possible to manufacture large-scale integrated circuits (LSI) including a CPU.

This embodiment can be implemented in combination with any of the above embodiment modes and the embodiments as appropriate.

Embodiment 5

In this embodiment, a procedure in the case of forming a plurality of semiconductor devices with the use of one base substrate will be described.

Figure 18A:
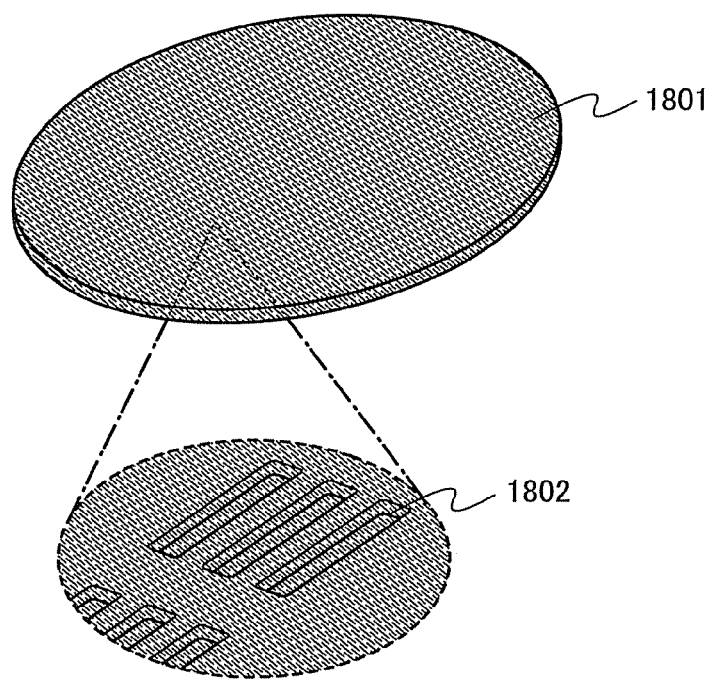
FIGS. 18A and 18B are diagrams showing a manufacturing method of a semiconductor device of the present invention.

FIG. 18A illustrates an external appearance of a bond substrate 1801 processed into a desired shape. FIG. 18A also shows a view in which a surface of the bond substrate 1801 is partially enlarged. Recesses 1802 later to be cavities are formed on a surface of the bond substrate 1801. Note that FIG. 18A illustrates a case where a semiconductor device is manufactured in accordance with the manufacturing method described in Embodiment Mode 3. Accordingly, only the recesses 1802 are formed on the surface of the bond substrate 1801, and there is no projection formed thereon. However, not only the recesses but also a projection may be provided on the surface in accordance with the manufacturing method described in Embodiment Mode 4.

Figure 18B:
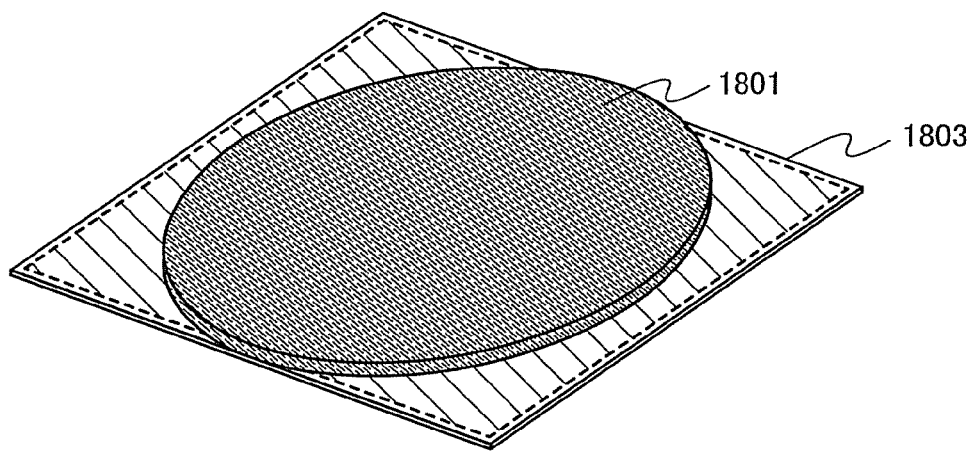

Next, as shown in FIG. 18B, a bond substrate 1801 is bonded to the base substrate 1803 by attachment. The bond substrate 1801 is bonded to the base substrate 1803 so that the surface of the bond substrate, which has the recesses 1802 faces the base substrate 1803.

Figure 19A:
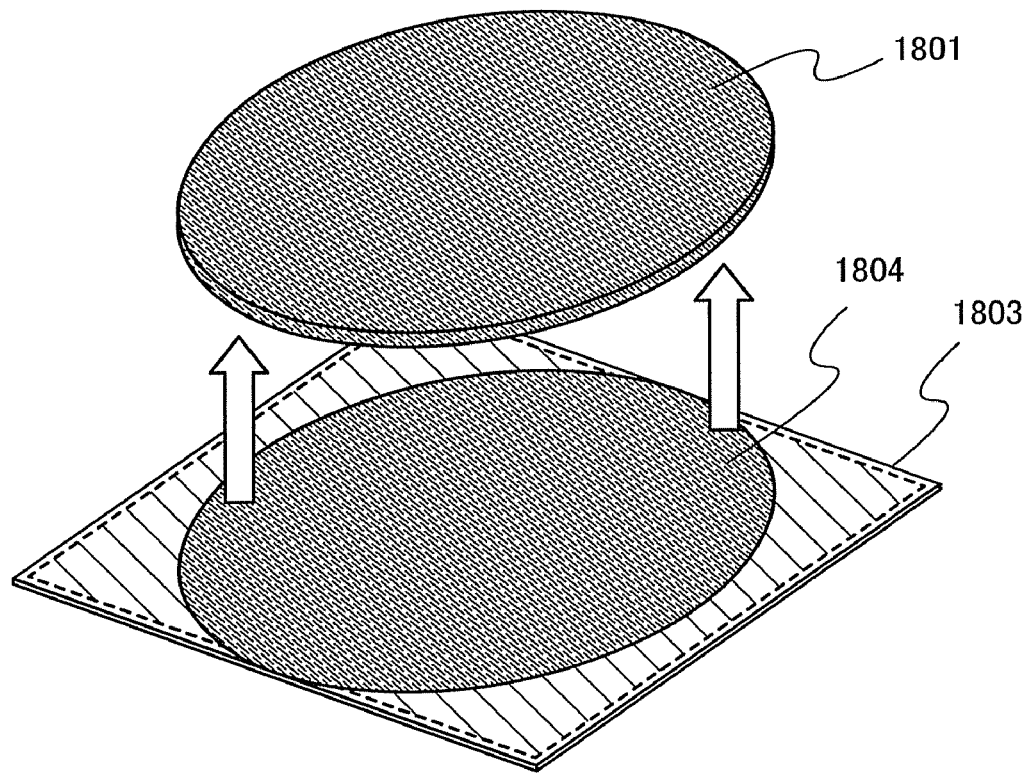
FIGS. 19A and 19B are diagrams showing a manufacturing method of a semiconductor device of the present invention.
Figure 19B:
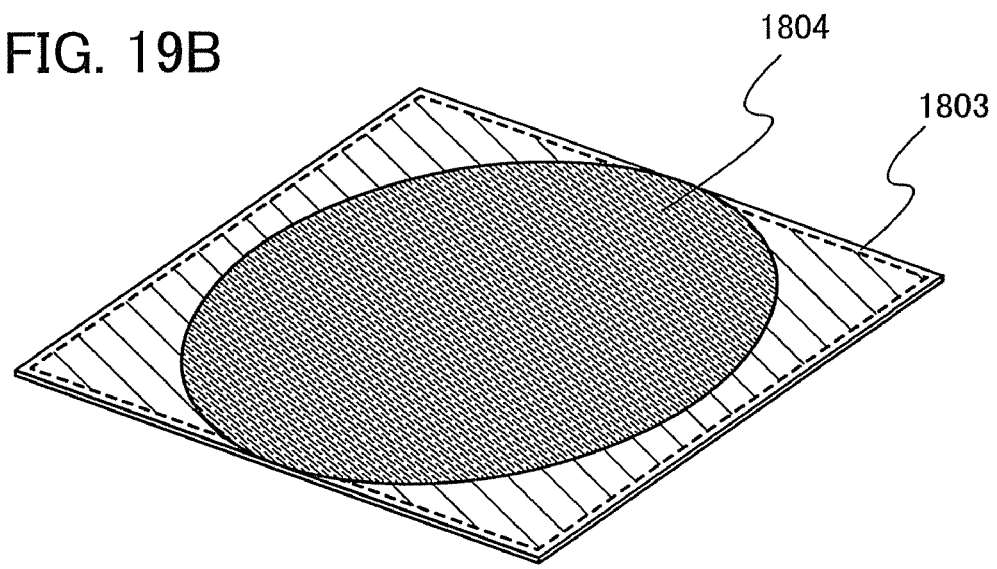

Then, the bond substrate 1801 is split as shown in FIG. 19A, whereby a semiconductor film 1804 which is part of the bond substrate 1801 is transferred to the base substrate 1803 as shown in FIG. 19B. Cavities formed with the recesses 1802 are provided between the semiconductor film 1804 and the base substrate 1803.

Figure 20:
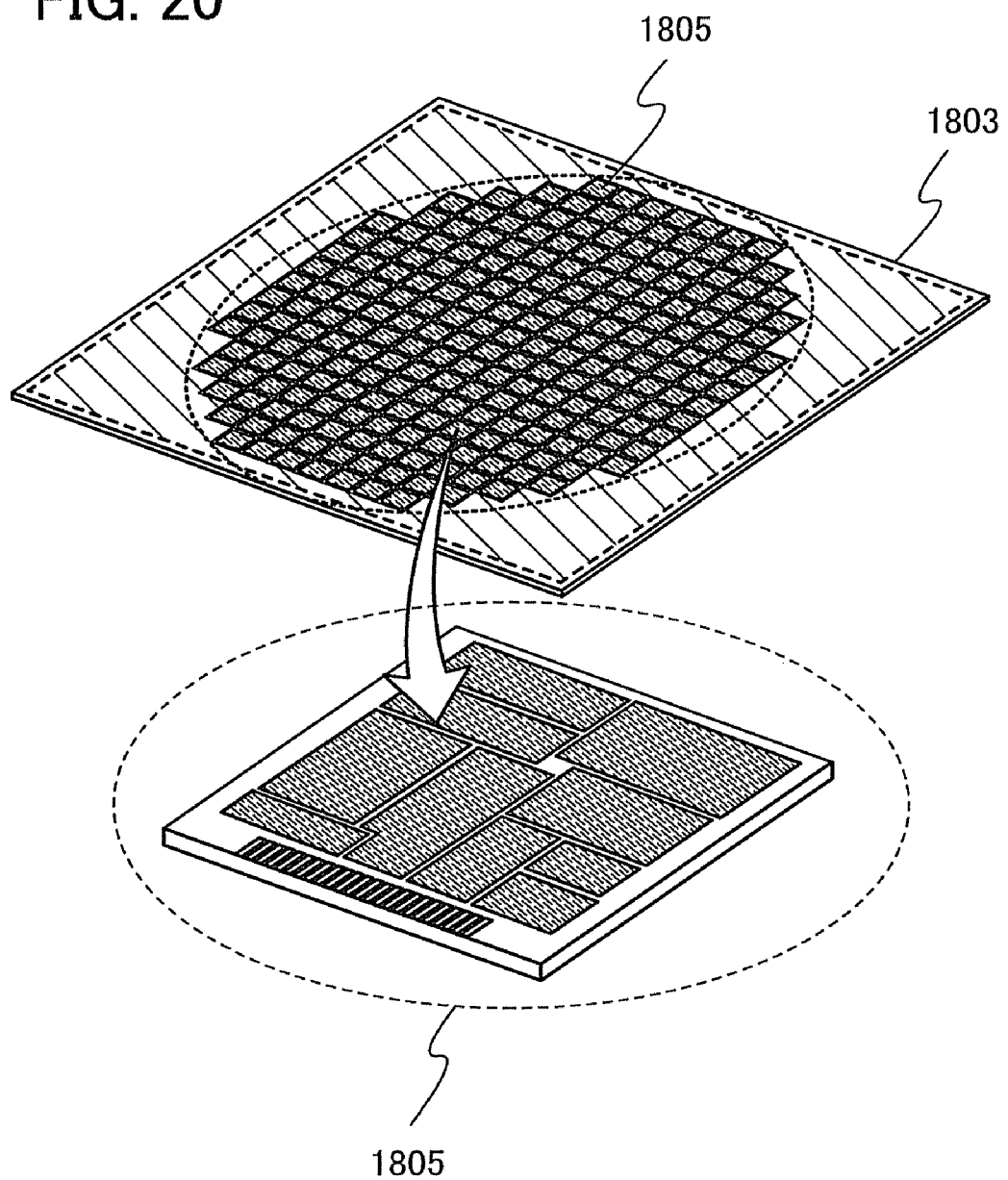
FIG. 20 is a diagram showing a manufacturing method of a semiconductor device of the present invention.

Then, as shown in FIG. 20, a plurality of semiconductor devices 1805 is formed using the semiconductor film 1804 formed over the base substrate 1803, and the semiconductor devices 1805 with the base substrate 1803 are separated by dicing or the like. The above-described structure makes it possible to manufacture the plurality of semiconductor devices 1805.

Note that, although the case where a pair of the base substrate 1803 and the bond substrate 1801 is bonded to each other is described in this embodiment, the present invention is not limited to this structure. A plurality of bond substrates 1801 may be bonded to one base substrate 1803. Note that, in this case, plane orientations of the bond substrates 1801 are aligned, and thereby crystal plane orientations of a plurality of semiconductor films formed over the base substrate 1803 can be aligned; thus, characteristics of the semiconductor devices 1805 can be uniform.

This embodiment can be implemented in combination with any of the embodiment modes and the embodiments as appropriate.

Embodiment 6

Figure 21A:
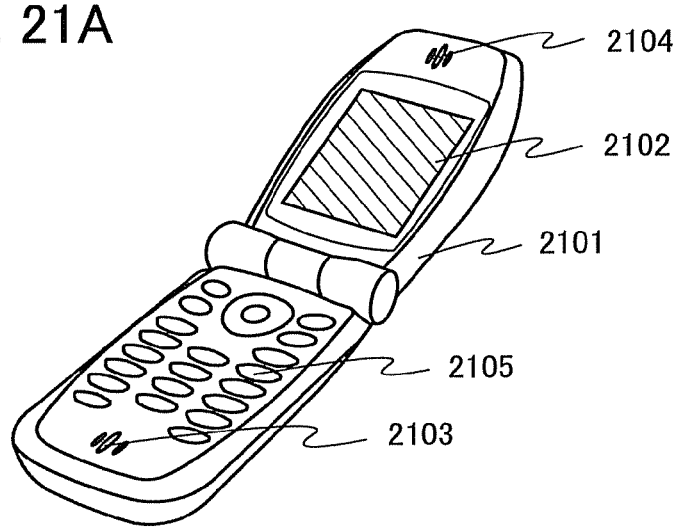
FIGS. 21A to 21C are diagrams of electronic devices in each of which a semiconductor device of the present invention is used.
Figure 21B:
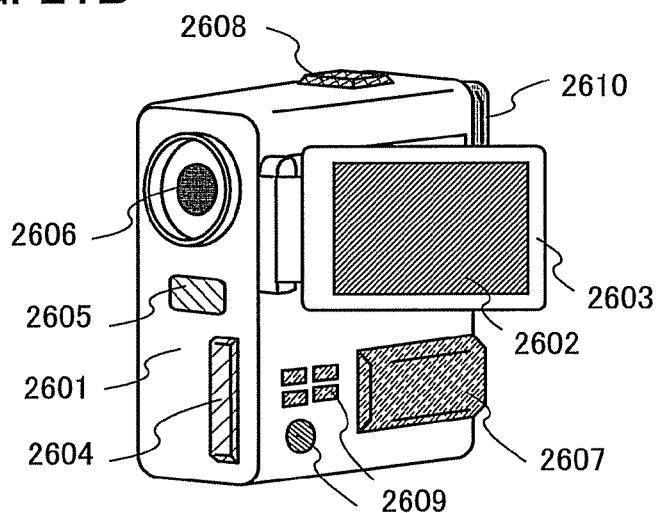
Figure 21C:
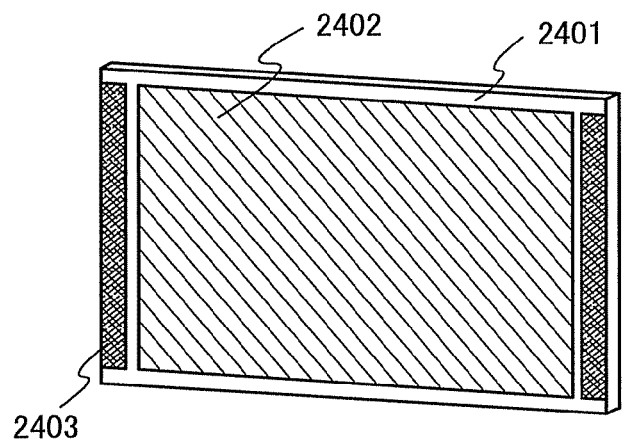

As an electronic device which can use the semiconductor device of the present invention, a mobile phone, a portable game machine, an electronic book, a camera such as a video camera or a digital still camera, a goggle display (a head mounted display), a navigation system, an audio reproducing device (e.g., a car audio component or an audio component set), a laptop computer, an image reproducing device provided with a recording medium (typically, a device for reproducing a recording medium such as a digital versatile disc (DVD) and having a display for displaying the reproduced image), and the like can be given. FIG. 21A to FIG. 21C show specific examples of these electronic devices.

FIG. 21A shows a mobile phone, which includes a main body 2101, a display portion 2102, an audio input portion 2103, an audio output portion 2104, and operation keys 2105. By using the display device of the present invention for the display portion 2102, a highly reliable, high performance mobile phone in which power consumption can be suppressed can be obtained.

FIG. 21B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the display device of the present invention for the display portion 2602, a highly reliable, high performance video camera in which power consumption can be suppressed can be obtained.

FIG. 21C shows an image display device, which includes a housing 2401, a display portion 2402, a speaker portion 2403, and the like. By using the display device of the present invention for the display portion 2402, a highly reliable, high performance image display device in which power consumption can be suppressed can be obtained. Note that the image display device corresponds to all image display devices for displaying images, such as those for personal computers, television broadcast reception, and advertisement display.

As described above, the application range of the present invention is extremely wide and the present invention can be applied to electronic devices in all fields.

This embodiment can be implemented in combination with any of the embodiment modes and the embodiments as appropriate.

This application is based on Japanese Patent Application serial no. 2007-114922 filed with Japan Patent Office on Apr. 25, 2007, the entire contents of which are hereby incorporated by reference.

What is claimed is:

1. A semiconductor device comprising:
   a first insulating film formed over a base substrate;
   a second insulating film formed over the first insulating film; and
   a semiconductor film overlapping the second insulating film, the semiconductor film including a pair of impurity regions and a channel formation region with a recess,
   wherein the second insulating film is interposed between the first insulating film and the semiconductor film,
   wherein the channel formation region and the recess are provided between the pair of impurity regions,
   wherein the second insulating film has an opening, the opening is overlapped with the recess,
   wherein one cavity is formed between the recess and the first insulating film, and
   wherein the channel formation region is exposed to the one cavity.

2. The semiconductor device according to claim 1, wherein the first insulating film is formed between the base substrate and the second insulating film.

3. The semiconductor device according to claim 1, wherein the first insulating film is in contact with the base substrate.

4. A semiconductor device comprising:
a first insulating film formed over a base substrate;
a second insulating film formed over the first insulating film;
a semiconductor film overlapping the second insulating film, the semiconductor film including a pair of impurity regions and a channel formation region with a recess;
a gate insulating film formed over the semiconductor film; and
an electrode formed over the gate insulating film,
wherein the second insulating film is interposed between the first insulating film and the semiconductor film,
wherein the channel formation region and the recess are provided between the pair of impurity regions,
wherein the channel formation region overlaps with the electrode with the gate insulating film interposed therebetween,
wherein the second insulating film has an opening, the opening is overlapped with the recess,
wherein one cavity is formed between the recess and the first insulating film, and
wherein the channel formation region is exposed to the one cavity.

5. The semiconductor device according to claim 4, wherein the first insulating film is formed between the base substrate and the second insulating film.

6. A semiconductor device comprising:
a first insulating film formed over a base substrate;
a second insulating film formed over the first insulating film;
a semiconductor film overlapping the second insulating film, wherein a first recess and a second recess are provided in the second insulating film and the semiconductor film;
a gate insulating film formed over the semiconductor film; and
an electrode formed over the gate insulating film,
wherein the semiconductor film comprises a channel formation region overlapping with the electrode with the gate insulating film interposed therebetween, and a pair of impurity regions with the channel formation region interposed therebetween,
wherein a first cavity is formed between the first recess and the first insulating film,
wherein a second cavity is formed between the second recess and the first insulating film,
wherein one of the pair of impurity regions overlaps with the first cavity,
wherein the other of the pair of impurity regions overlaps with the second cavity,
wherein the semiconductor film includes a third recess,
wherein one third cavity is formed between the third recess and the first insulating film, and
wherein the channel formation region is exposed to the one third cavity.

7. The semiconductor device according to claim 6,
wherein the semiconductor film includes a plurality of the first recesses and a plurality of the second recesses, and
wherein the semiconductor device includes a plurality of the first cavities and a plurality of the second cavities.

8. The semiconductor device according to claim 6,
wherein the first insulating film is formed between the base substrate and the second insulating film.

9. The semiconductor device according to claim 6,
wherein the first recess is not overlapped with the channel formation region, and
wherein the second recess is not overlapped with the channel formation region.

10. The semiconductor device according to claim 6,
wherein the first recess is not overlapped with the channel formation region,
wherein the second recess is not overlapped with the channel formation region, and
wherein the third recess is overlapped with the pair of impurity regions and the channel formation region.

* * * * *